United States Patent
Kato et al.

(10) Patent No.: US 7,436,715 B2
(45) Date of Patent: Oct. 14, 2008

(54) NON-VOLATILE MEMORY DEVICE, AND CONTROL METHOD OF NON-VOLATILE MEMORY DEVICE

(75) Inventors: Kenta Kato, Aichi-ken (JP); Mitsuhiro Nagao, Gifu-ken (JP)

(73) Assignee: Spansion LLC, Sunnyvale, CA (US)

( * ) Notice: Subject to any disclaimer, the term of this patent is extended or adjusted under 35 U.S.C. 154(b) by 291 days.

(21) Appl. No.: 11/479,387

(22) Filed: Jun. 30, 2006

(65) Prior Publication Data
US 2007/0033333 A1   Feb. 8, 2007

Related U.S. Application Data

(63) Continuation-in-part of application No. PCT/JP2005/012033, filed on Jun. 30, 2005.

(51) Int. Cl.
*G11C 7/00* (2006.01)
(52) U.S. Cl. .............. 365/189.01; 365/185.2; 365/230.06
(58) Field of Classification Search ............ 365/189.01, 365/185.2, 230.06, 210, 63
See application file for complete search history.

(56) References Cited

U.S. PATENT DOCUMENTS 6,216,251 B1 * 4/2001 McGinn .................... 714/800

FOREIGN PATENT DOCUMENTS

| JP | 4192196 | 7/1992 |
|---|---|---|
| JP | 11096781 | 4/1999 |
| JP | 2001176290 | 6/2001 |
| JP | 2002150789 | 5/2002 |
| JP | 2002367390 | 12/2002 |
| JP | 2005012033 | 1/2005 |

* cited by examiner

*Primary Examiner*—Son Dinh

(57) ABSTRACT

In a memory cell array, aside from a normal-data storing region, a control-information storing region is also allocated, and the control-information storing region is composed of a predetermined number of control-information storing memory cells in each bit of control information, and same bit data is stored in the predetermined number of control-information storing memory cells, and the data is read out simultaneously at the time of reading out. When being read-out the control information, since data is read out simultaneously from the predetermined number of memory cells, the driving capacity of reading route when reading out is reinforced. Reading time of control information being read out at the time of turning on the power or initializing after resetting can be shortened, and the operation can be quickly transferred to normal access action.

29 Claims, 19 Drawing Sheets

NON-VOLATILE MEMORY DEVICE, AND CONTROL METHOD OF NON-VOLATILE MEMORY DEVICE

CROSS-REFERENCES TO RELATED APPLICATIONS

This is a continuation in part of International Application No. PCT/JP2005/012033, filed Jun. 30, 2005 which was not published in English under PCT Article 21(2).

TECHNICAL FIELD

The invention relates to a non-volatile memory device having control information necessary for data access operation stored in part area of memory cell array.

BACKGROUND ART

A non-volatile memory device disclosed in patent document 1 includes a memory cell array having a plurality of non-volatile memory cells capable of rewriting data electrically disposed in a matrix. In the memory cell array, an initial setting data region is preliminarily provided as a region for writing various initial setting data necessary for initializing an EEPROM. The initial setting data is the information about memory operating condition.

The memory cell array has a plurality of planes. As shown in FIG. 14, in each plane 110, sixteen memory cells MC are connected in series, and one cell unit NCU is composed, and a plurality of cell units NCU commonly disposing word lines WLn (n=0 to 15) are provided, and cell blocks B0, B1, to Bn are composed as minimum units for erasing data. The plurality of cell blocks B0, B1, to Bn is disposed with, a common bit line BL.

In the plane 110, for example, the cell block Bn is determined as an initial setting data region for storing initial setting data. The initial setting data region reads out initial setting data, same as reading of a normal memory cell, by selective driving of a bit line BL and a word line WLn.

As shown in FIG. 15, when the power is turned on, and the power is stabilized, a reading mode of initial setting data is set. As a result, the initial setting data in the initial setting data region is read out, and validity of this initial setting data is verified. If validity is confirmed (PASS), the read initial setting data is transferred, and if validity is not confirmed (FAIL), a judgement signal is outputted, and the read initial setting data is handled as invalid data, and the chip status is fixed in FAIL state.

Patent document 2 is known as other related art. When turning on the power, current is supplied to bit lines not only through a route passing reading load and first transistor, but also through a route passing second transistor, and it is intended to shorten the time until the bit lines are charged to initial potential.

Patent document 1: Japanese Unexamined Patent Application Publication No. 2004-152413 (FIG. 1, FIG. 2, FIG. 7)

Patent document 2: Japanese Unexamined Patent Application Publication No. 11 (1999)-265595

DISCLOSURE OF THE INVENTION

Problems to be Solved by the Invention

As the memory device is becoming smaller in miniaturization and larger in capacity, write protect information, internal generation voltage, signal generation timing, and various trimming information are increasing in the quantity of information. Patent document 1 provides means for storing a huge quantity of information in a minimum required occupied area. By storing control information such as initial setting data in the memory cell array region, the increasing quantity of information is stored in a minimum required occupied area.

In this patent document 1, however, as compared with the case of storing write protect information and various trimming information near the individual required circuits, the reading route of control information becomes very long, and the wiring load increases. Or driving capacity of individual memory cells may not be assured sufficiently. As a result, the reading time of control information may become longer.

Patent document 2 can shorten the precharge time of charging the reading route of bit lines and others to initial potential. However, reading time of control information after precharge depends on the driving capacity of memory cells. If driving capacity of memory cells is not assured enough, it takes a longer time in reading control information out of the memory cell array. As a result, much time may be spent in initial setting operation before transfer to normal access when turning on the power or when resetting.

Incidentally, when a larger bias than that in normal use is applied to the memory cell, driving capacity can be raised when reading control data. For example, the bias voltage applied to a gate terminal of a non-volatile memory cell is raised when being read-out the control information. However, application of larger bias than that in normal use leads to an excessive stress application to the memory cell, and it is not preferred from the viewpoint of device reliability. Besides, if a bias different from normal use is applied, a bias generating circuit for this purpose is needed, and the circuit configuration is complicated, and the circuit scale is increased.

Means for Solving the Problems

The invention is conceived in the light of the above problems of the background art, and it is hence an object thereof to present a non-volatile memory device storing control information in a memory cell array, more specifically a non-volatile memory device capable of shortening the reading time by sufficiently assuring the driving capacity of the memory cell storing control information, and a control method of the non-volatile memory device.

In order to achieve the object, a non-volatile memory device according to the present invention comprises:

memory cell arrays allocated to normal-data storing regions and comprising memory cells; and memory cell arrays allocated to control-information storing regions, wherein the control-information storing regions comprise memory cells including a predetermined number of control-information storing memory cells per each bit of the control information, and wherein identical bit data are stored in the predetermined number of control-information storing memory cells and wherein data-readout of the predetermined number of control-information storing memory cells is performed simultaneously.

In the non-volatile memory device of the invention, a control-information storing region is allocated in the memory cell array aside from a normal-data storing region, and the control-information storing region is composed of a predetermined number of control-information storing memory cells per each bit of control information, and data of same bit is stored in the predetermined number of control-information storing memory cells, and they are read out simultaneously when being read-out.

In addition, in order to achieve the object, there is provided a control method in a non-volatile semiconductor device comprising memory cells allocated for storing normal data and memory cells allocated for storing control information, the control method comprising the steps of:

allocating a predetermined number of memory cells for each bit of the control information;

storing identical-bit data in the predetermined number of memory cells; and simultaneously reading out the identical-bit data stored in the predetermined number of memory cells.

In the control method of the non-volatile memory device of the invention, a predetermined number of memory cells are allocated for each bit of control information in the non-volatile memory device storing control information in addition to normal data, and data of same bit is stored in the predetermined number of memory cells. When being read-out, same bit data stored in the predetermined number of memory cells is read out simultaneously.

EFFECTS OF THE INVENTION

According to the invention, when being read-out the control information, since it is read out simultaneously from a predetermined number of memory cells per each bit, the driving capacity of reading route is reinforced when being read-out. It is hence possible to shorten the reading time of control information being read out in initial setting period when turning on the power source or when resetting, so that the operation can be quickly transferred to normal access action.

Since the driving capacity is reinforced by increasing the number of memory cells storing same bit data and reading out simultaneously, it is not required to apply a larger bias than that in normal use for assuring the driving capacity, and excessive stress application to a device such as the memory cell does not occur. It is free from deterioration of reliability of device. It is not necessary to add an exclusive bias generation circuit for outputting a different bias from that in normal access action. Hence, the circuit configuration can be simplified.

BEST MODE FOR CARRYING OUT THE INVENTION

A non-volatile memory device and control method of the non-volatile memory device of the invention are specifically described below by referring to the exemplary embodiments shown in FIG. 1 to FIG. 13.

Figure 1:
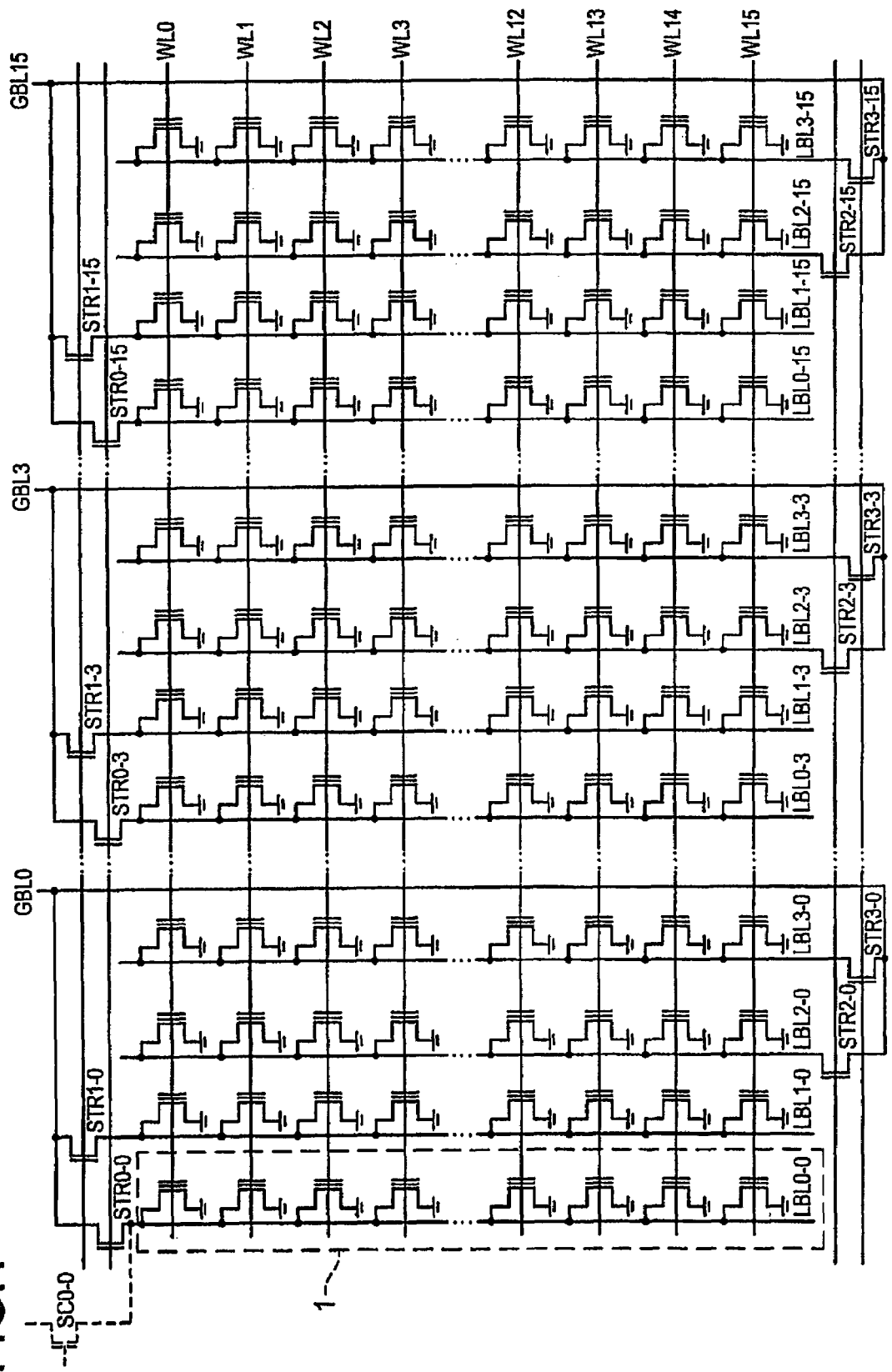
FIG. 1 is a diagram of a CAM cell array configuration (bit line common configuration) in a first embodiment.
Figure 2:
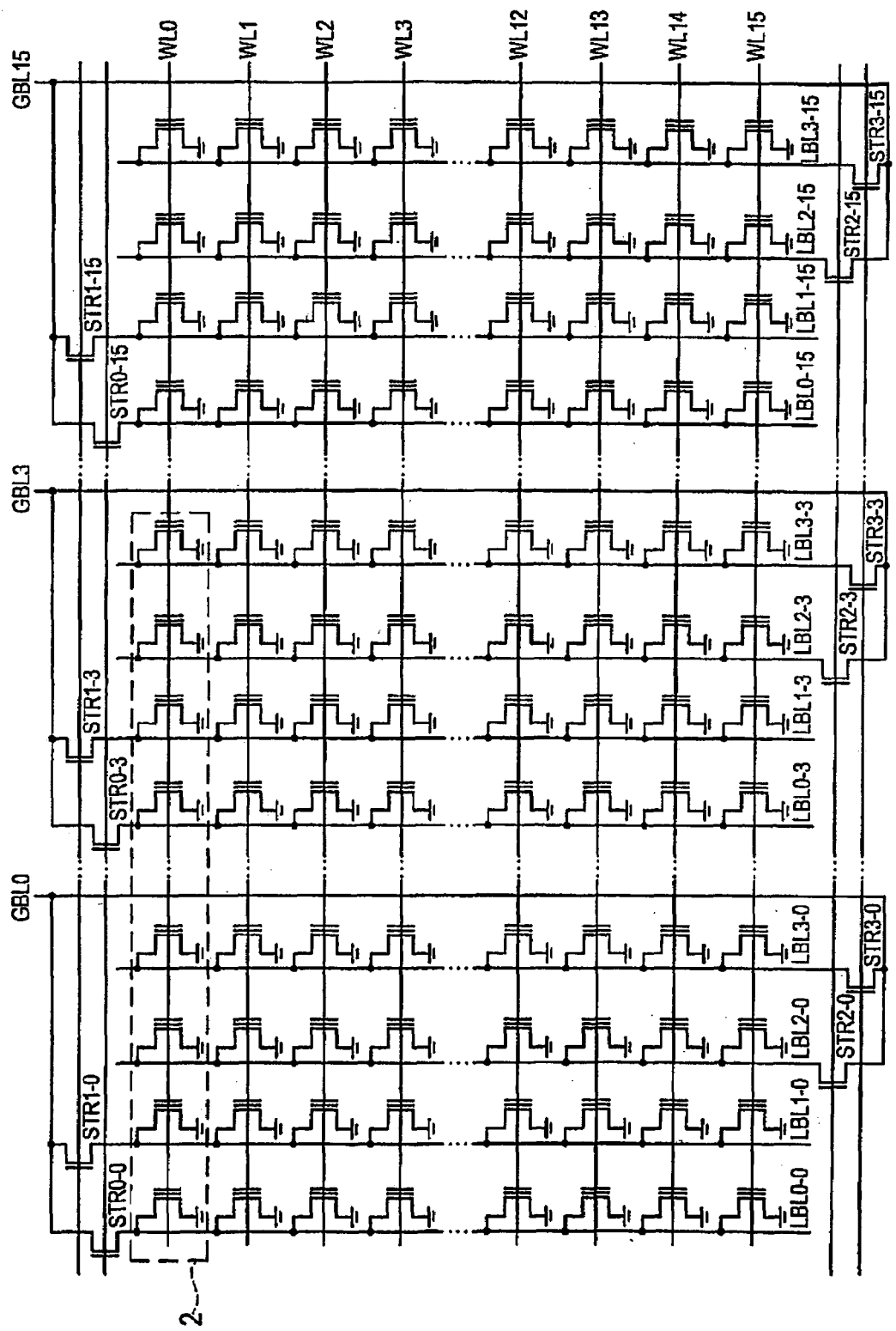
FIG. 2 is a diagram of a CAM cell array configuration (word line common configuration 1) in a second embodiment.
Figure 3:
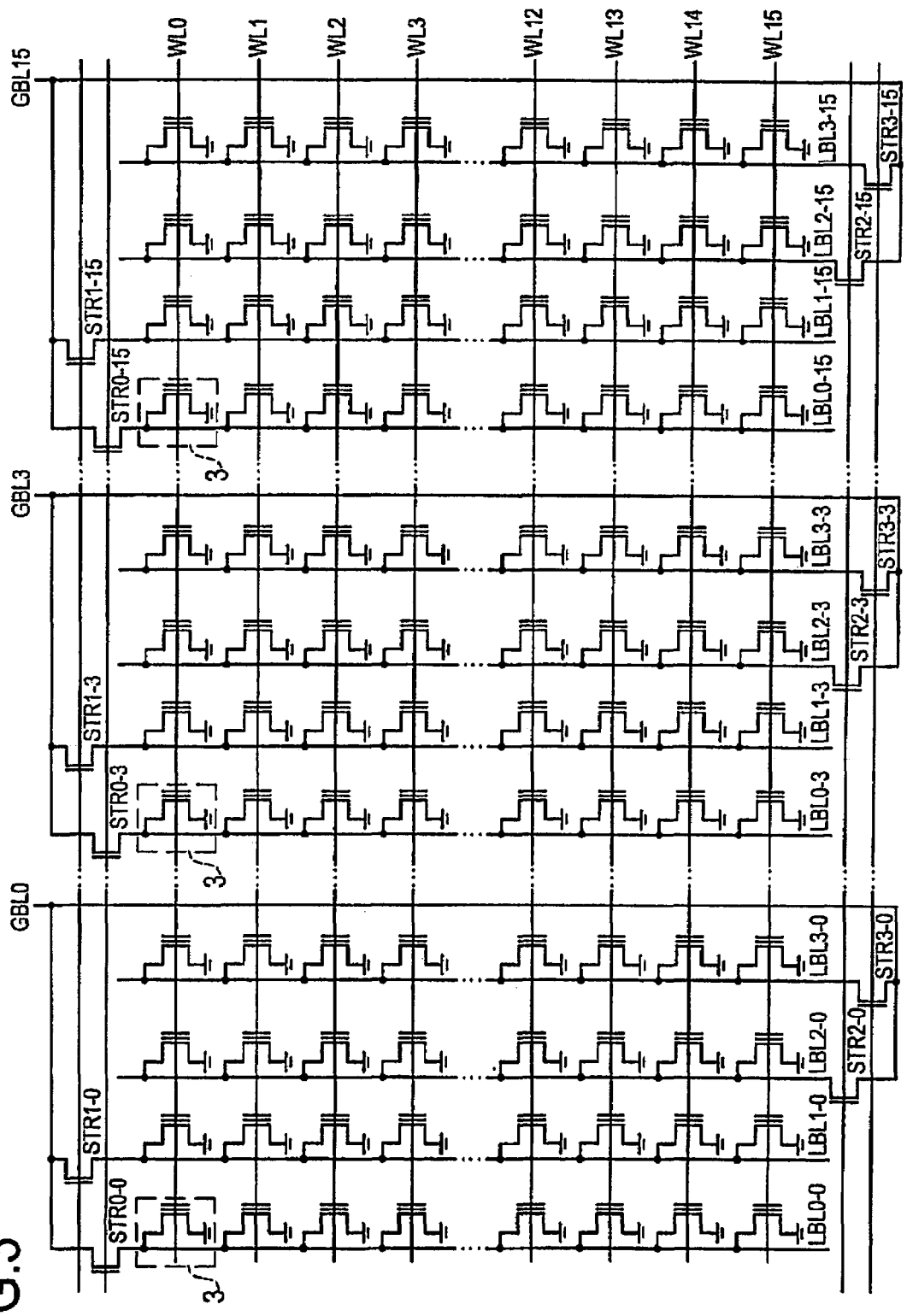
FIG. 3 is a diagram of a CAM cell array configuration (word line common configuration 2) in a third embodiment.

FIG. 1 to FIG. 3 show examples of a memory cell array of an NOR type non-volatile memory device. In these embodiments, a part of the memory cell array has a control-information storage memory cell (CAM cell) storing various control information such as write protect information being read out when initializing at the time of turning on the power source or resetting, internal generating voltage, signal generation timing, and various trimming signals.

The memory cell array shown in FIG. 1 to FIG. 3 has sixteen global bit lines GBL0 to GBL15, each including four local bit lines LBL0-0 to LBL3-0, to LBL0-15 to LBL3-15. In local bit lines LBL0-0 to LBL3-0, to LBL0-15 to LBL3-15, drain terminals of memory cells for biasing gate terminals from sixteen word lines WL0 to WL15 are connected. Source terminals are connected to the grounding potential as required. The local bit lines LBL0-0 to LBL3-0, to LBL0-15 to LBL3-15 are connected to the global bit lines GBL0 to GBL15 by way of selection switches STR0-0 to STR3-0 to STR0-15 to STR3-15.

In FIG. 1 to FIG. 3, a predetermined number of control-information storing memory cells (CAM cell array) are composed of sixteen CAM cells.

In the first embodiment in FIG. 1, memory cells connected to the local bit line LBL0-0 are allocated as the CAM cells, and a CAM cell array 1 is composed of sixteen CAM cells connected to the same bit line. The local bit line LBL0-0 constitutes an exclusive line for the CAM cell array 1 as a common data reading line. Same bit data is stored in sixteen CAM cells constituting the CAM cell array 1, and control information of one bit is stored in the CAM cell array 1. When being read-out the control information from the CAM cell array 1, and bit data is read out simultaneously from all CAM cells in the CAM cell array 1, and read out to outside from the global bit line GBL0 by way of the selection switch STR0-0. It may be also designed to read out by using a CAM selection switch SC0-0 connected to the local bit line LBL0-0, and connected to outside without resort to the global bit line GBL0.

Herein, the selection switch STR0-0 can be selected same as in selection operation in normal access action (not shown). The CAM selection switch SC0-0 may be also selected depending on the signal showing reading-out state of control information (SELCAM signal described below). At this time, if CAM cell array is present also in other local bit line (not shown), a local bit line is allocated for each CAM cell array, and a CAM selection switch is disposed in each allocated local bit line (not shown). It may be selected by a signal showing reading-out state of control information, or the signal including position information of the CAM cell array (SELCAM(X) signal mentioned below). On the other hand, in each CAM cell disposed in the CAM cell array 1, reading action occurs simultaneously, and word lines WL0 to WL15 are biased simultaneously by an address decoder (FIG. 4) described later.

In the second embodiment in FIG. 2, of the memory cells connected to the word line WL0, adjacent sixteen memory cells connected to global bit lines GBL0 to GBL3 are allocated as CAM cells, and a CAM cell array 2 is composed. The word line WL0 constitutes an exclusive line for the CAM cell array 2 as a common bias line. In the sixteen CAM cells constituting the CAM cell array 2, same bit data is stored, and control information of one bit is stored in the CAM cell array 2. When the control information is read out from the CAM cell array 2, bit data is read out simultaneously from all CAM cells in the CAM cell array 2, and is read out to outside from global bit lines GBL0 to GBL3, by way of selection switches STR0-0 to STR3-0 to STR0-3 to STR3-3. Data currents being read out to global bit lines GBL0 to GBL3 are all summed up in the switch circuit or the like not shown, and processed as one-bit data. Although not shown in the drawing, it may be also composed to read out by using CAM selection switch connected to local bit lines LBL0-0 to LBL3-0, to LBL0-3 to LBL3-3, and connected to outside without resort to global bit lines GBL0 to GBL3. In this case, too, the data currents being read out from individual CAM cells are summed up, and processed as one-bit data.

Herein, the word line WL0 can be selected same as in selection operation in normal access action (not shown). The selection switches STR0-0 to STR3-0, to STR0-3 to STR3-3 are selected in individual CAM cells disposed in the CAM cell array 2 simultaneously when being read-out, and are hence selected by the address decoder (FIG. 4) described later. CAM selection switches connected to local bit lines LBL0-0 to LBL3-0, to LBL0-3 to LBL3-3 can be selected depending on the signal showing reading-out state of control information (SELCAM signal described below). It may be selected by a signal showing reading-out state of control information, or the signal decoded depending on position information of the CAM cell array (SELCAM(X) signal mentioned below).

In a third embodiment in FIG. 3, same as in the second embodiment (FIG. 2), a CAM cell array 3 is composed of memory cells connected to the word line WL0 as CAM cells. In the third embodiment, the bit width of data input and output is composed of a parallel data route of 16 bits. Suppose a data route is allocated to each one of global bit lines GBL0 to GBL15. The CAM cell array 3 selects one CAM cell belonging to each data route of 16 bits in width in each data route, and the CAM cell array 3 is composed of sixteen CAM cells in total. Same bit data is stored in sixteen CAM cells constituting the CAM cell array 3, and control information of one bit is stored in the CAM cell array 3. When the control information is read out from the CAM cell array 3, bit data is read out simultaneously from all CAM cells in the CAM cell array 3. Data currents being read out from global bit lines GBL0 to GBL15 are all summed up in a switch circuit or the like not shown, and processed as one-bit data.

In the third embodiment, it is supposed that the data route is allocated to each global bit line, but allocation of a global bit line in each data route is not limited to this example alone. Although not shown in the drawing, one data route may be allocated to each one of a plurality of global bit lines. In this case, a switch circuit for selecting global bit lines and connecting to data routes may be added.

The word line WL0 is a common bias line, and an exclusive line of the CAM cell array 3 is composed. When control information is read out from the CAM cell array 3, data of individual CAM cells is read out to outside from global bit lines GBL0 to GBL15 by way of selection switches STR0-0 to STR0-15. Although not shown, it may be also designed to read out by using CAM selection switches connected to individual local bit lines LBL0-0 to LBL0-15, and connected to outside without resort to global bit lines GBL0 to GBL15.

Herein, the word line WL0 can be selected same as in selection operation in normal access action (not shown). The selection switches STR0-0 to STR0-15 are also selected same as in selection operation in normal access action, supposing parallel action of 16 bits in width. CAM selection switches connected to local bit lines LBL0-0 to LBL0-15 can be selected depending on the signal showing reading-out state of control information (SELCAM signal described below).

Configuration of the CAM cell array in the memory cell array is not limited to the structures of the first to the third embodiments (FIG. 1 to FIG. 3). When one CAM cell array is composed of sixteen CAM cells, for example, the CAM cell array can be composed of a set of sixteen memory cells connected to four word lines and four local bit lines. That is, by combination of I word lines and J local bit lines, a predetermined number of (sixteen in this case) memory cells can be selected as CAM cells.

Figure 4:
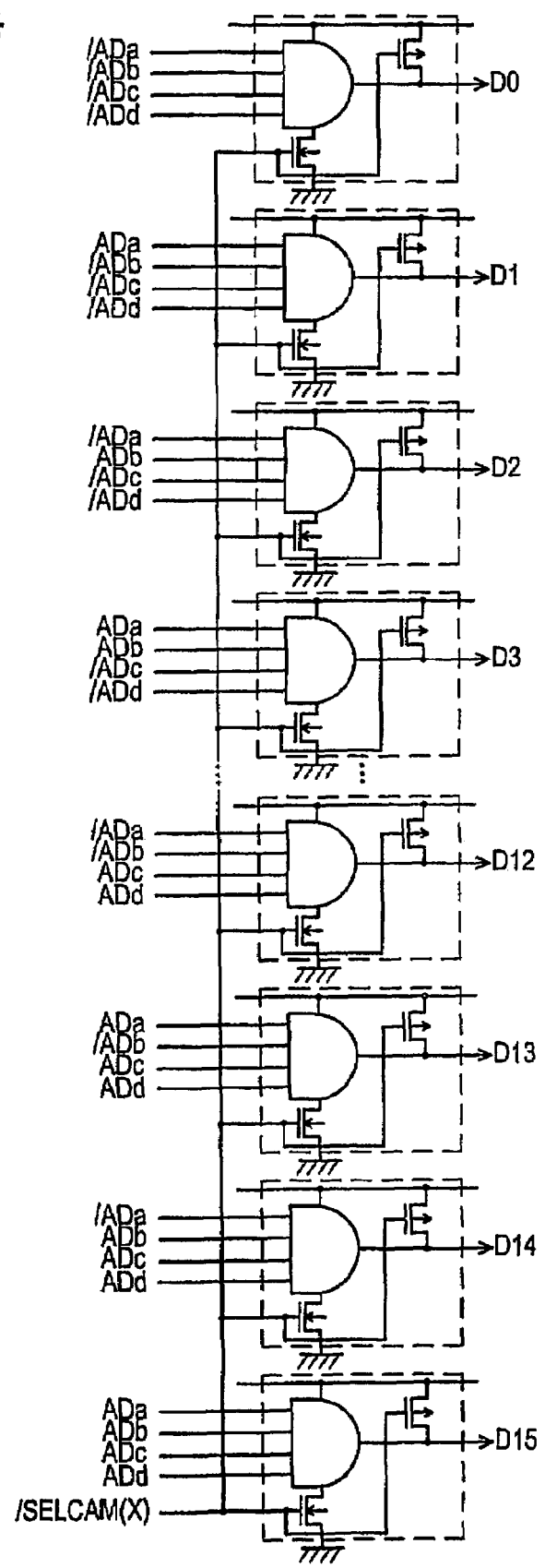
FIG. 4 is a diagram of an example of an address decoder having a changeover function of selection of normal memory cell and selection of a CAM cell array.

FIG. 4 shows a specific example of an address decoder for identifying sixteen CAM cells in CAM cell arrays 1 to 3. Depending on combination of four-bit address signals ADa to ADd, and their inverted signals /ADa to /ADd, sixteen sets of AND gates are provided for selecting any one of decode signals D0 to D15, and in each AND gate, the CAM cell array select signal /SELCAM(X) for selecting the CAM cell array when being read-out the control information is inputted. Suppose plural sets of CAM cell arrays are provided. The suffix (X) in the CAM cell array select signal /SELCAM(X) denotes that the CAM cell arrays provided in a plurality of sets are identified. In each a plurality of address decoders provided depending on the position of configuration of memory cells in the memory cell array, the CAM cell array select signal /SELCAM(X) is inputted for identifying the corresponding CAM cell arrays.

In normal access action, the CAM cell array select signal /SELCAM(X) is at high level. Therefore, depending on combination of address signals ADa to ADd, and their inverted signals /ADa to /ADd, a decode signal of high level is outputted from any AND gates out of sixteen sets of AND gates. A CAM cell corresponding to a decode signal of high level is selected. Herein, when selecting the CAM cell alone, a programming is considered.

When control information is read out, the CAM cell array select signal /SELCAM(X) is at low level. Therefore, regardless of combination of address signals ADa to ADd, and their inverted signals /ADa to /ADd, signals outputted from all sixteen sets of AND gates are at high level, and sixteen CAM cells for composing a CAM cell array can be selected. By selecting all of sixteen CAM cells for composing the CAM cell array, same bit data stored in each CAM cell can be read out simultaneously.

Figure 5:
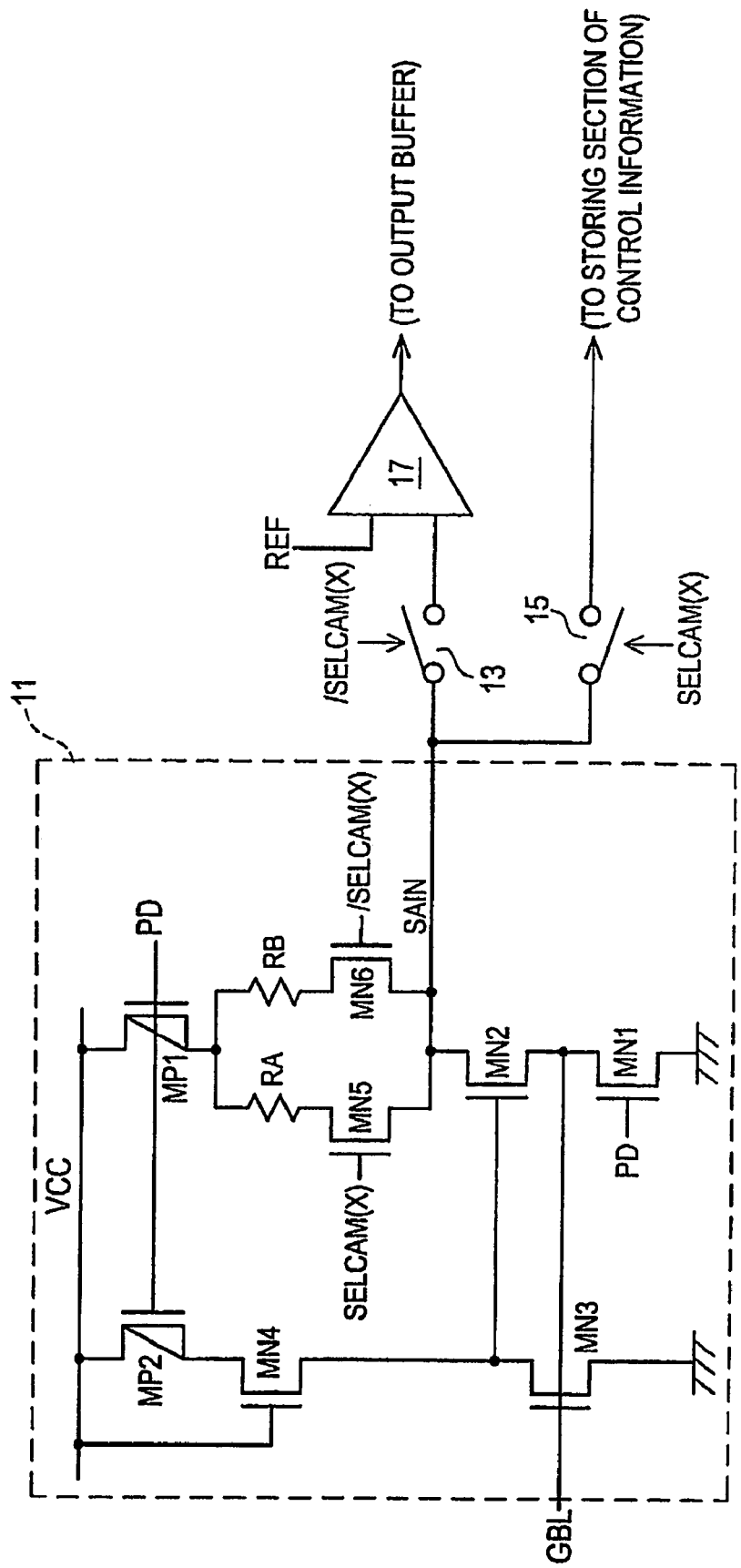
FIG. 5 is a diagram of a circuit configuration of using a cascode circuit commonly in reading normal data and reading CAM data.

FIG. 5 shows a circuit portion for transferring bit data being read out in global bit line GBL to output buffer (not shown) or a storing section (not shown) of control information. In the non-volatile memory device, bit data stored in the memory cell is stored as threshold voltage of the memory cell. At the time of reading out, when biasing the gate terminal of the memory cell from the word line, the memory cell becomes non-conductive state or conductive state depending on the altitude of threshold voltage. At this time, the current route in which the drain terminal of the memory cell is connected is precharged at high voltage level (about 0.5 to 1 V), and the source terminal of the memory cell is connected to grounding potential, and therefore when the memory cell is in conductive state, the current flows toward the grounding potential by way of the memory cell, but current does not flow in non-conductive state. By reading out presence or absence of this current flow, the bit data can be read out.

The global bit line GBL is connected to a cascode circuit 11 for converting presence or absence of current flow toward the memory cell into the altitude of the voltage level. In the cascode circuit 11, bit data converted into the voltage signal is outputted from a terminal SAIN as a voltage conversion signal SAIN. The terminal SAIN is connected to one terminal of a switch 13 or 15. The switch 13 is controlled by the CAM cell array select signal /SELCAM(X). When the CAM cell array select signal /SELCAM(X) is at high level, that is, in normal access action not in the state of reading out control information, the switch 13 conducts. The switch 15 is controlled by an inverted signal of the CAM cell array select signal /SELCAM(X), that is, the CAM cell array select signal SELCAM(X). When the CAM cell array select signal SELCAM(X) is at high level, that is, in the state of reading out control information, the switch 15 conducts. Other terminal of the switch 13 is connected to one input terminal of a sense amplifier 17. A reference voltage REF determined by a reference cell or the like is inputted into other input terminal of the sense amplifier 17. Other terminal of the switch 15 is directly connected to the storing section of control information.

The cascode circuit 11 is composed of PMOS transistors MP1, MP2, NMOS transistors MN1 to MN6, and resistance elements RA, RB. The series-connected resistance element RA and the NMOS transistor MN5, and the series-connected resistance element RB and the NMOS transistor MN6 are respectively connected to a supply voltage VCC by way of the PMOS transistor MP1, and connected to a grounding potential by way of series-connected NMOS transistors MN2 and MN1. As other route leading to grounding potential from supply voltage VCC, a route is formed by the PMOS transistor MP2 and NMOS transistors MN4, MN3. A power-down signal PD is inputted into gate terminals of PMOS transistors MP1, MP2 and the NMOS transistor MN1. The gate terminal of NMOS transistor MN2 is connected to a drain terminal of the NMOS transistor MN3, a gate terminal of NMOS transistor MN3 is connected to global bit line GBL, and a gate terminal of the NMOS transistor MN4 is connected to supply voltage VCC. In gate terminals of NMOS transistors MN5, MN6, mutually complementary signals CAM cell array select signals SELCAM(X) and /SELCAM(X) are applied.

From the terminal SAIN at a connection point of NMOS transistors MN2, MN5, MN6, the voltage conversion signal SAIN is outputted as voltage converted bit data.

In the cascode circuit 11, when the power is down, that is, when the power-down signal PD is at high level, PMOS transistors MP1, MP2 are not conducting, while the NMOS transistor MN1 is conducting, and therefore the global bit line GBL is maintained at low level. When transferred to access state from power-down state, the power-down signal PD is inverted to low level. As a result, the NMOS transistor MN1 does not conduct, and PMOS transistors MP1, MP2 conduct, and thereby the terminal SAIN and the global bit line GBL are precharged to high level.

In this state, data access is executed. When the threshold voltage of the memory cell is low, data current flows from the PMOS transistor MP1 through any selected route of the resistance element RA and the NMOS transistor MN5, or the resistance element RB and the NMOS transistor MN6, and the NMOS transistor MN2.

In the global bit line GBL shown in FIG. 5, when being read-out the control information, data current flows from sixteen CAM cells composing the CAM cell array. That is, data current of 16 times of data current flowing in normal access action flows.

When being read-out the normal data, the CAM cell array select signal /SELCAM(X) becomes high level, and a current route from the NMOS transistor MN6 through the resistance element RB is formed. Data current from the memory cell is stepped down through the resistance element RB, and is outputted as the voltage converted signal SAIN lowered in voltage level. Voltage drop in this case is small, and it is required to compare with the reference voltage REF and amplify in the sense amplifier 17 by conducting the switch 13. This is the data reading action in the prior art. That is, after detecting the data current as a small voltage drop, by comparing with the reference voltage REF, it is amplified to a logical level signal, and the logical level signal is obtained by two-step amplifying procedure.

By contrast, when being read-out the control information, the CAM cell array select signal SELCAM(X) becomes high level, and a current route from the NMOS transistor MN5 through the resistance element RA is formed. Data current from the CAM cell array is stepped down through the resistance element RA, and is outputted as the voltage converted signal SAIN lowered in voltage level. In this case, the data current has a current value of 16 times of current value in normal data, and it is possible to lower the voltage converted signal SAIN by an amplitude of logical level. That is, the data current can be converted into the voltage signal of logical level. The voltage signal of logical level can be obtained through conversion procedure of one-step composition. Data current can be promptly converted into the voltage signal of logical level.

Further, if the data current is sufficiently large when being read-out the control information, even if the resistance element RA is lower than the resistance element RB, the voltage drop of the voltage conversion signal SAIN can be set at logical voltage level. While realizing prompt conversion from data current into the voltage signal at logical level, in the cascode circuit 11, precharge action when being read-out the control information can be executed promptly. Since the terminal SAIN and the global bit line GBL are precharged through the resistance element RA, low resistance of the resistance element RA contributes to elevation of speed in precharging.

Figure 6:
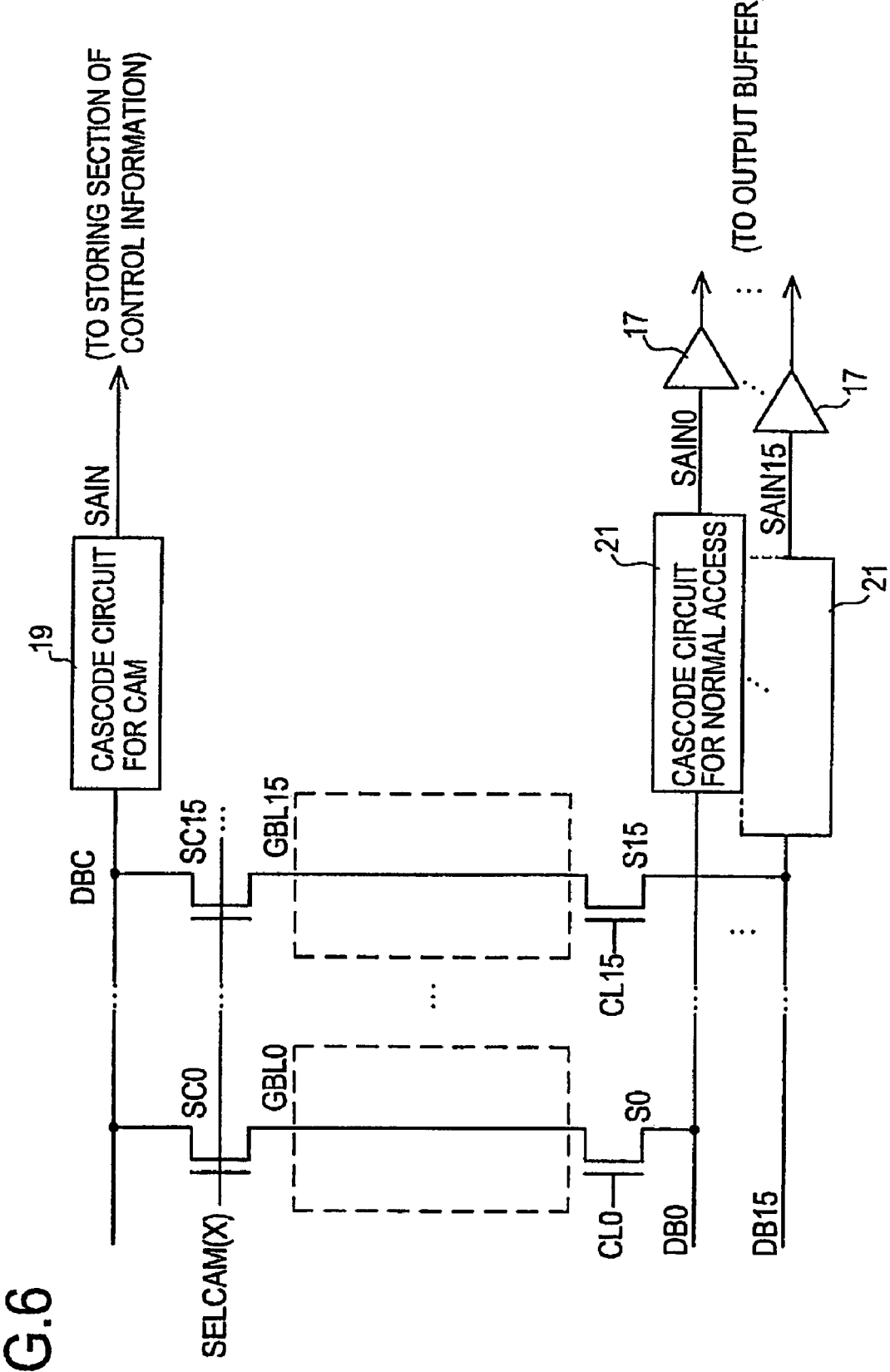
FIG. 6 is a diagram of a circuit configuration of having cascode circuits individually for reading normal data and reading CAM data.

FIG. 6 shows a configuration of the cascode circuit for converting the data current being read out from global bit lines GBL0 to GBL15 into voltage, by referring to an example of the third embodiment (FIG. 3).

When being read-out the normal bit data, switches S0 to S15 are provided in the route from individual global bit lines GBL0 to GBL15 to data lines DB0 to DB15. The switches S0 to S15 are selected by selection signals CL0 to CL15 obtained by decoding the address signals depending on the memory cells (not shown) to be accessed. In FIG. 6, according to the third embodiment (FIG. 3), data lines DB0 to DB15 are provided for each one of global bit lines GBL0 to GBL15, but the circuit configuration is not limited to this structure alone. For example, a plurality of global bit lines can be selected by column select switches and connected to one data line.

Each one of data lines DB0 to DB15 is connected to the cascode circuit 21 for normal access, and each output terminal is connected to each sense amplifier 17. The constitution of the cascode circuit 21 for normal access is similar to the cascode circuit 11 shown in FIG. 5, except that the resistance element RB is fixed and provided instead of the resistance element RA, the NMOS transistor MN5, the resistance element RB, and the NMOS transistor MN6. It has same action and effect as the cascode circuit 11. The data current being read out from the memory cell is converted into voltage conversion signals SAIN0 to SAIN15 of a small voltage signal in the cascode signal 21 for normal access, and compared and amplified in the sense amplifier 17 in two-step structure.

When being read-out the control information from the CAM cell array, global bit lines GBL0 to GBL15 reading out data currents from individual CAM cells are connected to a CAM data line DBC by way of CAM reading switches SC0 to SC15. CAM reading switches SC0 to SC15 are commonly controlled by the CAM cell array select signal SELCAM(X), and hence conducts simultaneously when being read-out from the corresponding CAM cell array.

The CAM data line DBC is connected to a CAM cascode circuit 19, and its output terminal SAIN is connected to the storing section of control information. The structure of the CAM cascode circuit 19 is similar to the cascode circuit 1 shown in FIG. 5, except that the resistance element RA is fixed and provided instead of the resistance element RA, the NMOS transistor MN5, the resistance element RB, and the NMOS transistor MN6. It has same action and effect as the cascode circuit 1. The data current being read out from the memory cell is converted into the voltage conversion signal SAIN of logical level in the CAM cascode circuit 19 in one-step structure.

Figure 7:
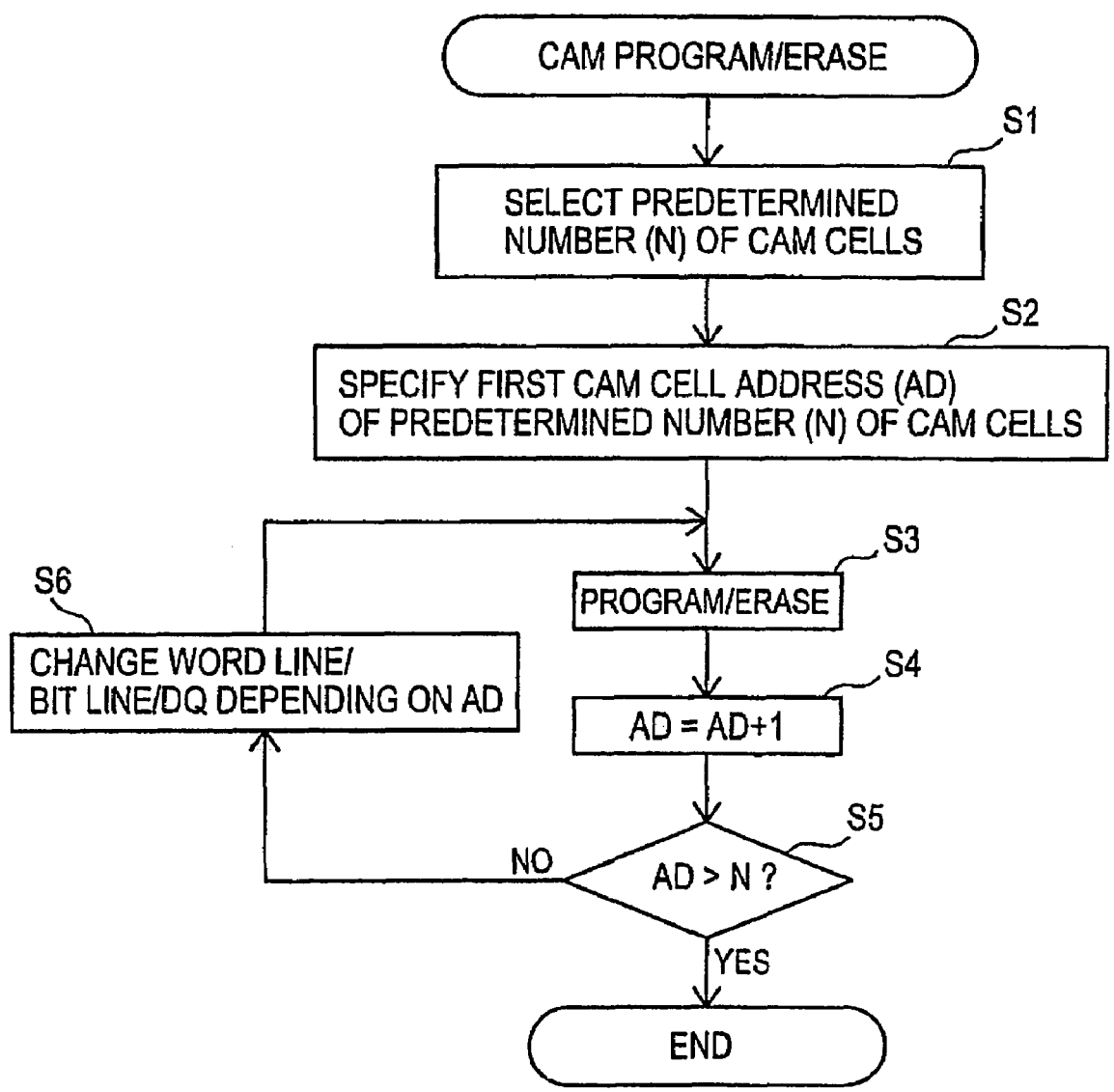
FIG. 7 is a flowchart of program or erase in a CAM cell array.
Figure 8:
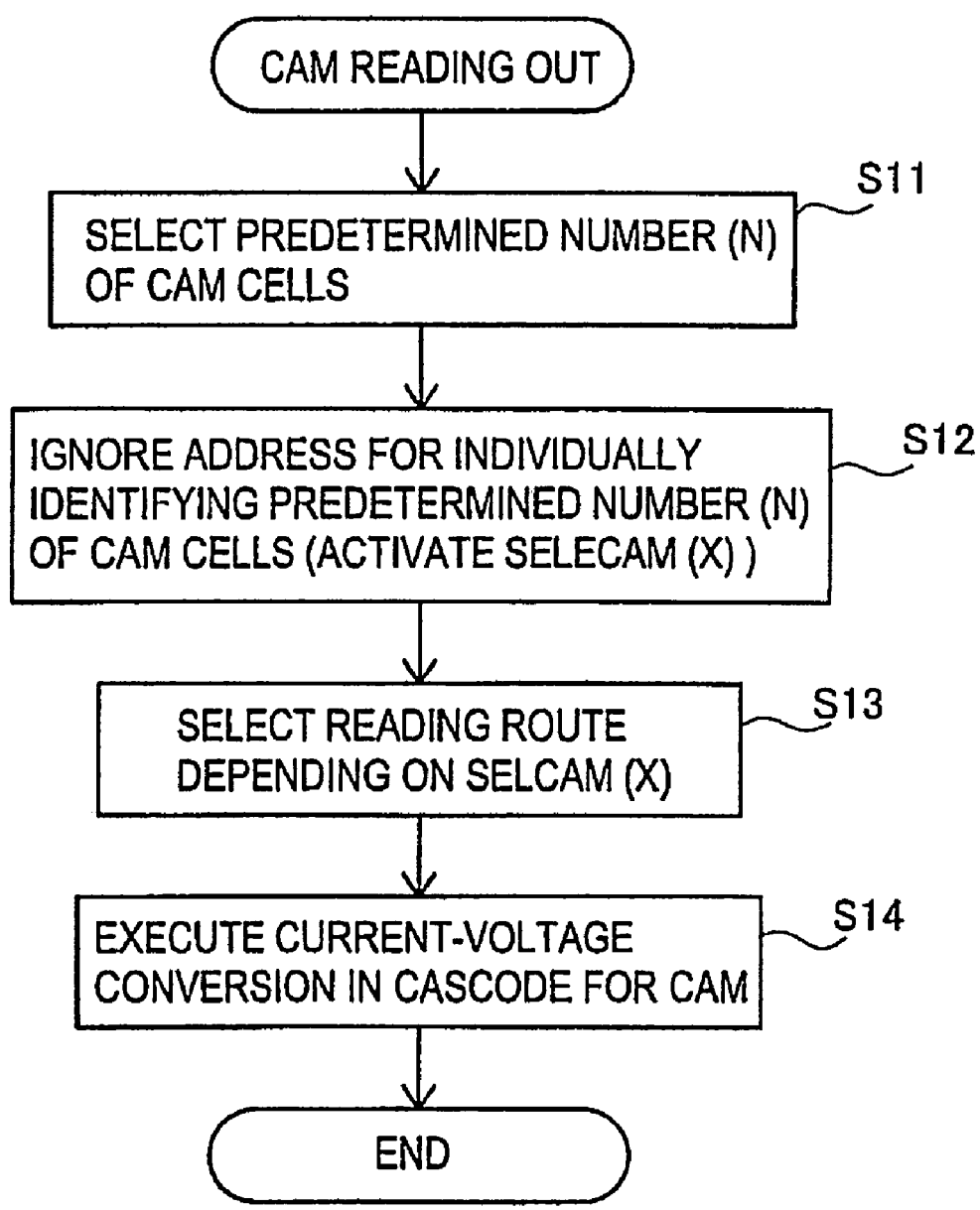
FIG. 8 is a flowchart of reading out data from a CAM cell array.

FIG. 7 and FIG. 8 are flowcharts of access action on the CAM cell array. The CAM cell array is composed of a predetermined number of CAM cells (sixteen cells in the first to the third embodiments) so as to store one-bit data, and an access sequence different from normal access storing one-bit data in one memory cell is required. The flowcharts shown in FIG. 7 and FIG. 8 are executed by an internal control circuit for managing sequence control such as a state machine. FIG. 7 is a flow of program or erase, and FIG. 8 is a flow of data reading out.

The flow of program or erase in FIG. 7 is explained. First, in the object CAM cell array of program (erase), a predetermined number (N) of CAM cells to be composed is selected (S1). Of the predetermined number (N) of CAM cells, the CAM cell to be programmed (erased) in the first place is specified. Specifically, the address (AD) of the corresponding CAM cell is specified (S2). The CAM cell of the specified address (AD) is programmed (erased) (S3). After programming (erasing), the address (AD) is incremented (AD=AD+1) (S4). It is judged if the incremented address (AD) is over the predetermined number (N) or not (S5), and if not over (No at S5), word line/bit line/data line (DQ) is changed depending on the new address (AD) (S6), and program (erase) is executed again (S3). If the incremented address (AD) is over the predetermined number (N) (Yes at S5), it is understood that program (erase) is finished in all CAM cells for composing the CAM cell array, and the program (erase) processing is terminated.

The data reading-out flow in FIG. 8 is explained. First, in the CAM cell array of reading object, a predetermined number (N) of CAM cells to be composed are selected (S11). A control signal for ignoring the address for individually identifying the predetermined number (N) of CAM cells is activated (in this case, CAM cell array select signal SELCAM(X) is activated) (S12). Depending on the CAM cell array select signal SELCAM(X), conduction of the switch for connecting between the bit line and the cascode circuit is controlled, and the data reading route is selected (S13). Depending on the selected data reading route, data currents read out simultaneously from the predetermined number (N) of CAM cells are applied into the CAM cascode circuit, and current-voltage conversion is executed (S14). As a result, the voltage conversion signal SAIN of logical level is outputted, and applied into the storing section of control information.

Figure 9:
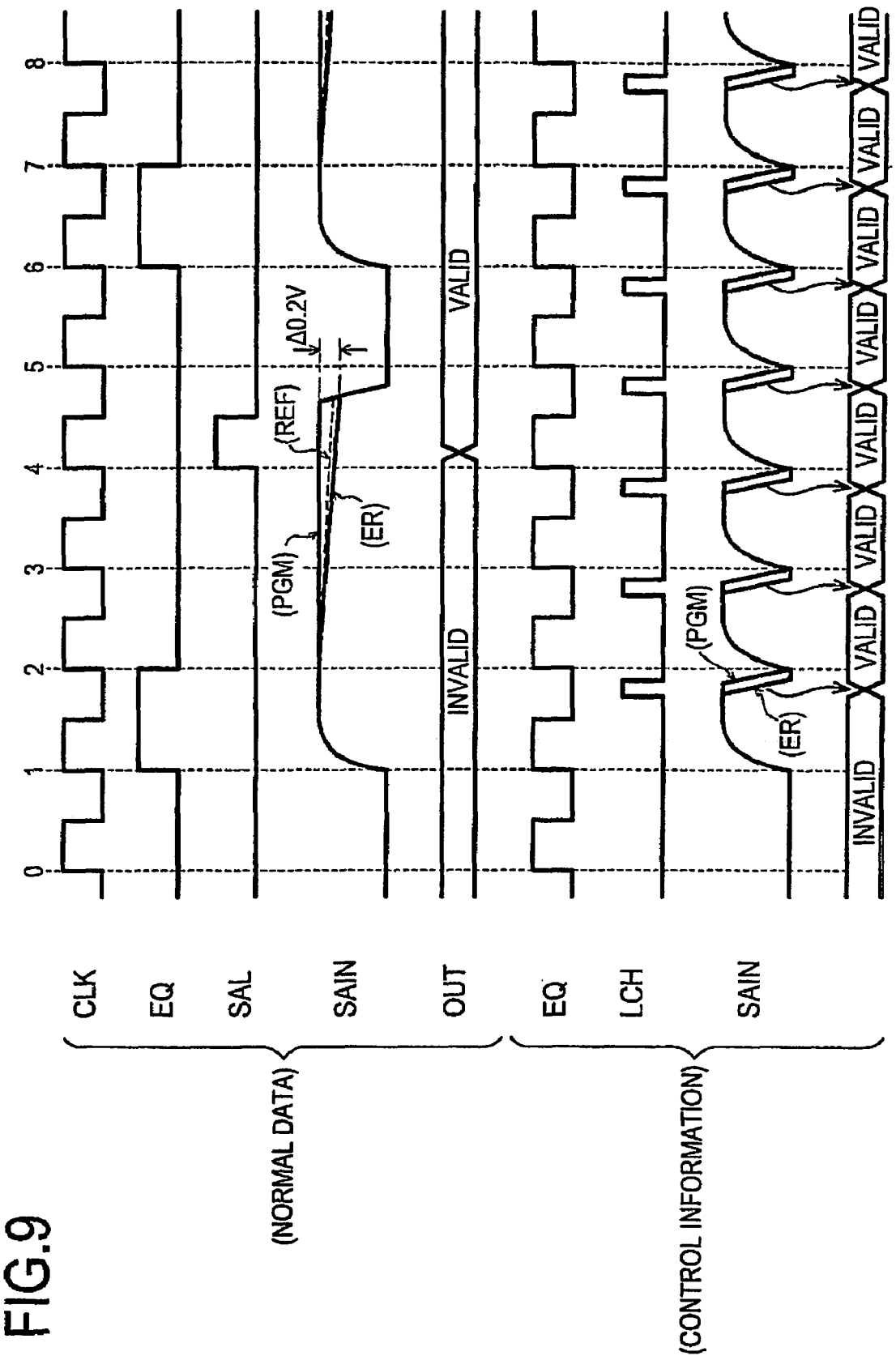
FIG. 9 is a timing chart of reading out control information in contrast to reading out normal data.

FIG. 9 is a comparative diagram of a timing chart of normal data reading and a timing chart of control information reading. An example of the non-volatile memory device for synchronizing a clock signal CLK is shown. In both charts, when an equalize signal EQ becomes high level, and the voltage conversion signal SAIN is precharged to high level, bit data is read out. The bit data being read out is converted into the voltage signal as the voltage conversion signal SAIN.

When being read-out the normal data, in the clock cycle when the equalize signal EQ becomes high level, the terminal SAIN is precharged to high level, and bit data stored in the memory cell is read out from next clock cycle. In the program state (PGM) of the memory cell, data current does not flow, and the voltage conversion signal SAIN maintains high level. In erase state (ER) of the memory cell, data current flows, and the voltage conversion signal SAIN drops along with the time. The dotted line indicated in the middle of a PGM waveform and an ER waveform in the voltage conversion signal SAIN shows the reference voltage (REF) by the reference cell. Since the data current being read out from the memory cell is slight, the decline speed of the voltage conversion signal SAIN in erase state (ER) is also slight. After three clock signals from start of data reading, a sense amplifier latch signal SAL is outputted in pulses, and it is possible to compare with the reference voltage (REF) in the sense amplifier, and it can be amplified up the logical level. As a result, valid data (Valid) as an output signal OUT is obtained. Five clock cycles are required from data reading cycle.

By contrast, when being read-out the control data, within one clock cycle, precharge action by the equalize signal EQ of high level, and latch action by an latch signal LCH are enabled. By the data current of control information of one bit data being read out from the CAM cell array after precharge action, the voltage conversion signal SAIN drops suddenly. Since the data current is reinforced by a predetermined number of times from data reading time, the voltage is converted at high speed in the cascode circuit. In the program state (PGM) in the CAM cell array, data current does not flow, same as in the case of normal data. Since the data current being read out from the CAM cell array is sufficiently large, in the erase state (ER), the voltage conversion signal SAIN decline to low level suddenly. The signal is converted to logical level in the clock cycle upon start of data reading.

Depending on the latch signal LCH, valid data (Valid) is stored in the storing section of control information.

Figure 10:
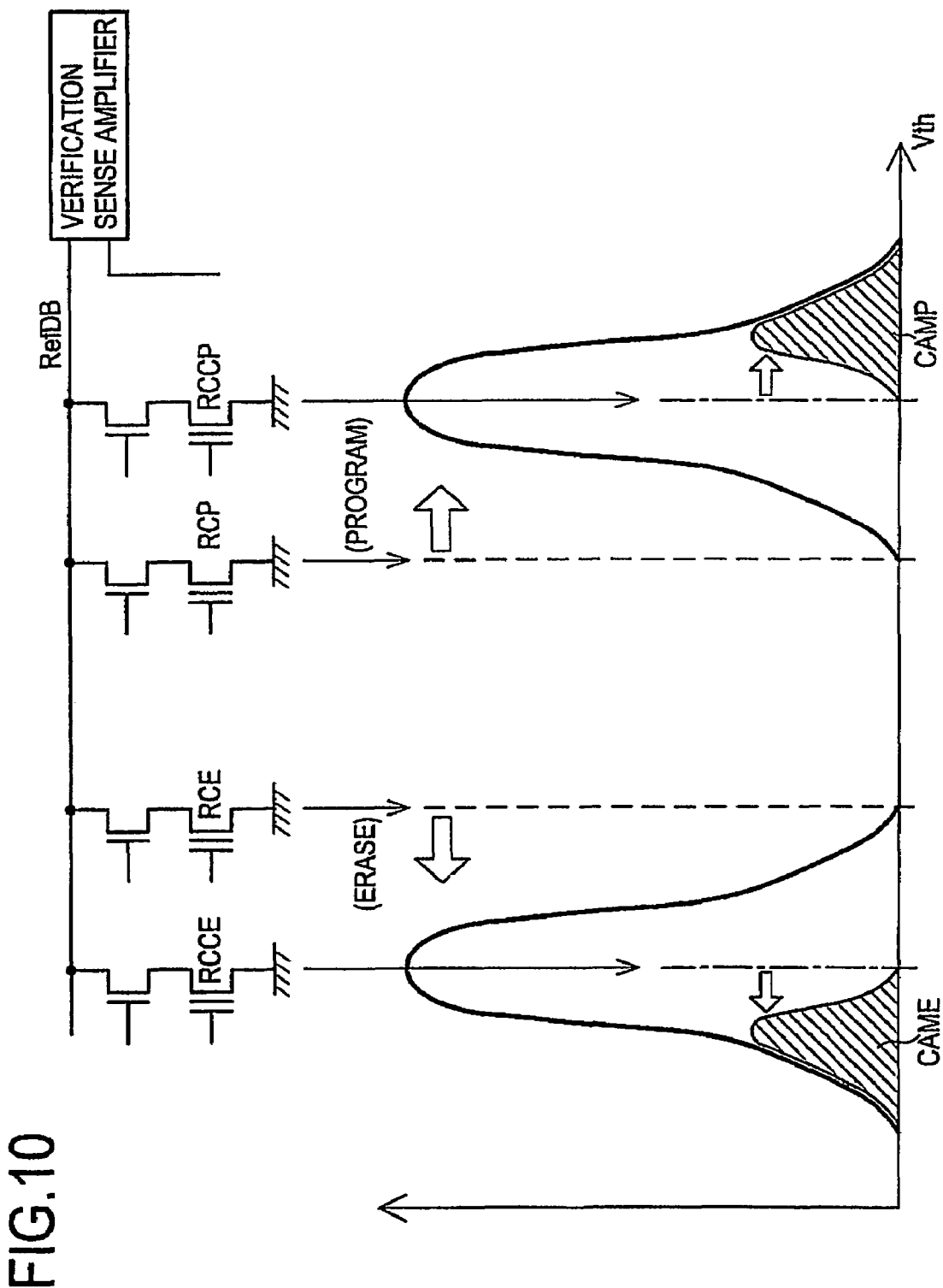
FIG. 10 is a diagram of threshold voltage distribution of a reference cell when verifying and a cell after verifying, in memory cell and CAM cell.

FIG. 10 is a diagram showing distribution of threshold voltage of bit data stored in the CAM cells for constituting the CAM cell array. In program and erase in CAM cells, exclusive reference cells RCCP, RCCE are prepared aside from reference cells RCP, RCE used for normal memory cells.

The exclusive reference cell for program RCCP has a larger threshold voltage than the reference cell RCP in program of normal data. Accordingly, distribution of threshold voltage of CAM cells in which program data is written is a profile having a peak at higher threshold voltage side in distribution of threshold voltage of normal memory cells in which program data is written.

The exclusive reference cell for erase RCCE has a smaller threshold voltage than the reference cell RCE in erase of normal data. Accordingly, distribution of threshold voltage of CAM cells in which erase data is written is a profile having a peak at lower threshold voltage side in distribution of threshold voltage of normal memory cells in which erase data is written.

In the CAM cells in erase state, a larger data current flows than that in normal memory cells. In the CAM cells in program state, further larger data current does not flow as compared with that in normal memory cells.

Accordingly, when being read-out the control information in erase state, in addition to the fact that the number of cells is reinforced by a predetermined number of times, a large current flows, and hence the level can be converted to low logical level suddenly in the cascode circuit. When being read-out the control information in program state, if the number of cells is fortified by a predetermined number of times, since the threshold voltage is a larger threshold voltage as compared with that of the normal memory cells, leak current in bias application can be suppressed, and false detection in the cascode circuit can be prevented.

Figure 11:
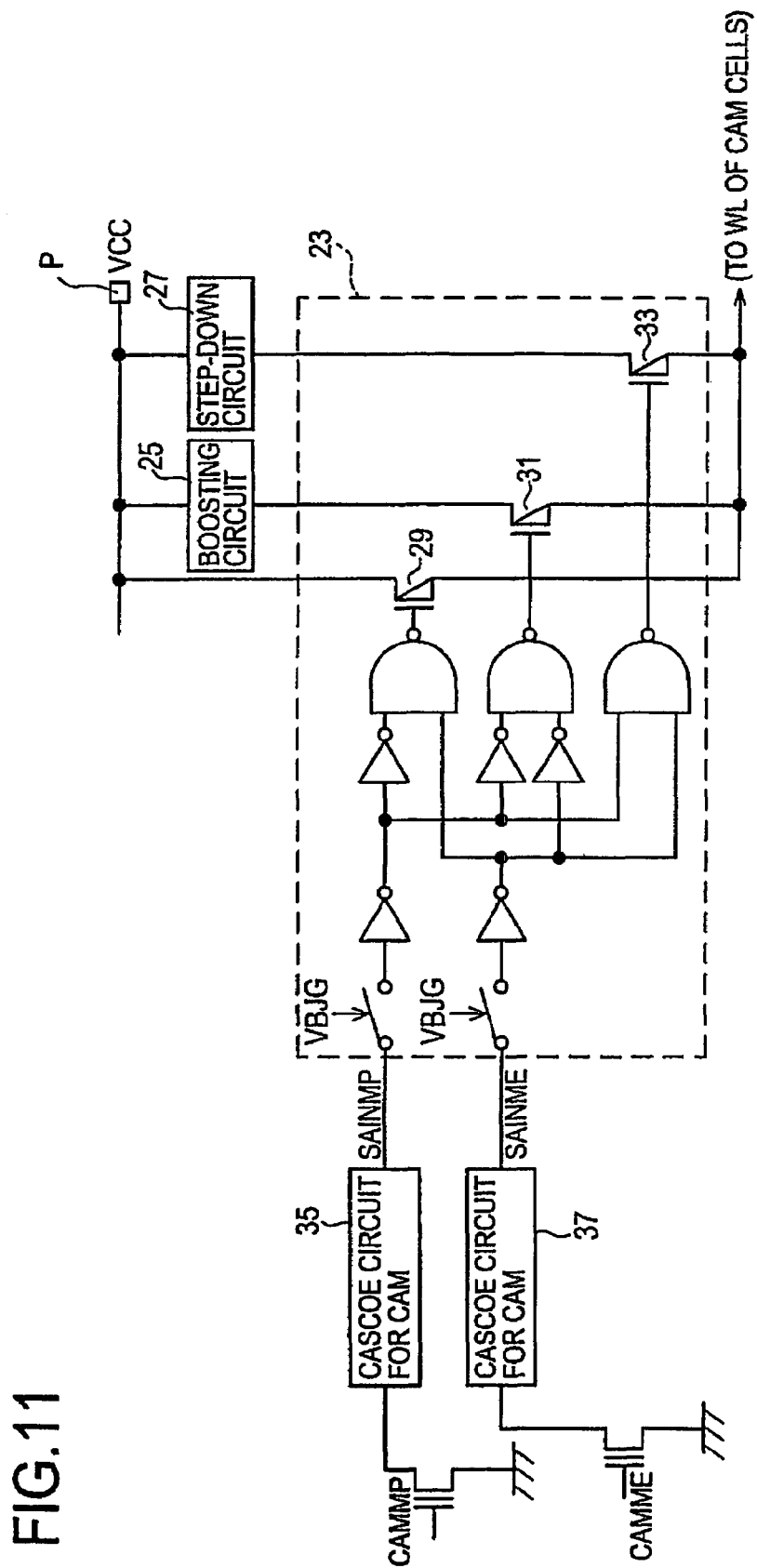
FIG. 11 is a circuit diagram of a bias changeover section for changing over the bias voltage of a word line when being read-out, depending on the data being read out from a CAM monitor cell.
Figure 12:
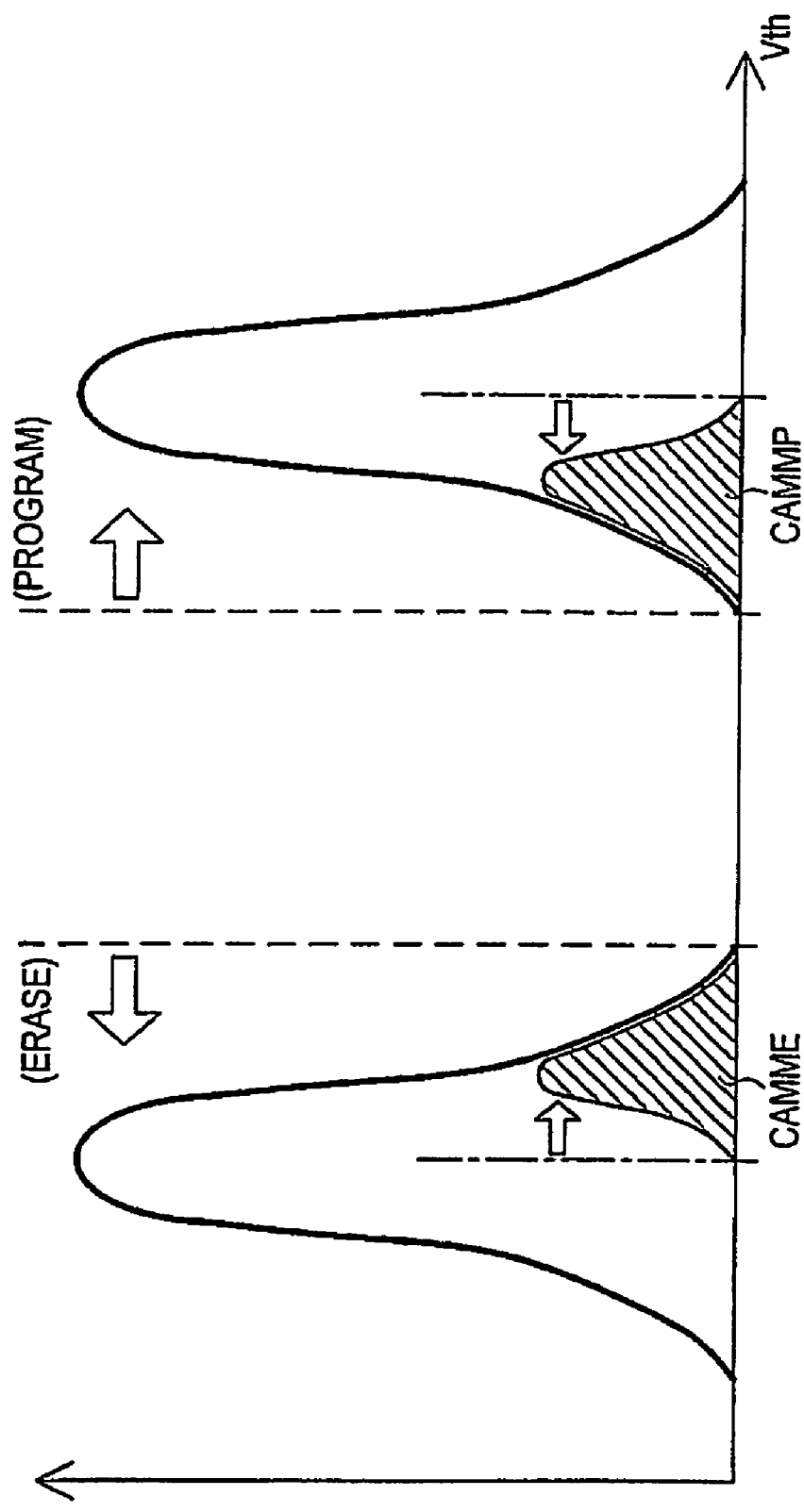
FIG. 12 is a diagram of threshold voltage distribution of the reference cell when verifying and a cell after verifying, in the CAM monitor cell.

FIG. 11 and FIG. 12 explain the method of adjusting the bias voltage to be applied to word lines when being read-out the CAM cell array. When turning on the power or initializing after resetting, prompt reading of initialization information or control information is essential for shortening the transfer time to normal access after initialization. When turning on the power or initializing after resetting, circuit operations may be unstable. In particular, when being read-out the normal memory cells, it is general to apply a boosted bias voltage to word lines, but a predetermined waiting time is needed until the boosted voltage level is stabilized. Accordingly, as the bias voltage to be applied to the CAM cell array, if supply voltage VCC without boosting can be used, waiting time until the voltage generating circuit is stabilized is not needed, and it is very convenient. In FIG. 11 and FIG. 12, as the voltage level of bias voltage applied to the CAM cell array, the supply voltage VCC is used, and only when application of supply voltage VCC is not appropriate, it is designed to change over to boosted or lowered bias voltage.

FIG. 11 shows a circuit example of changing over connection of voltage source to be supplied to the word line of CAM cells depending on a bias changeover unit 23. Switches 29, 31, and 33 composed of PMOS transistors connect the supply voltage VCC supplied from the external terminal P, output of a boosting circuit 25, and output of a step-down circuit 27 to bias supply lines to word lines WL of CAM cells. CAM monitor cells CAMMP and CAMME preliminarily set in program state and erase state are provided. The CAM monitor cells CAMMP and CAMME are provided as cells for monitoring the state of data bits stored in the CAM cell array, and the configuration of CAM monitor cells CAMMP and CAMME is same as the configuration of the CAM cell array. That is, consisting of a predetermined number of CAM cells, the connecting relation of bit lines and word lines is similar to the connecting relation in the CAM cell array. The CAM monitor cells CAMMP and CAMME are connected to the bias changeover circuit 23 by way of cascode circuits for CAM 35, 37, respectively. Voltage conversion signals SAINMP, SAINME outputted from cascode circuits 35, 37 are logically operated by way of the switch. Depending on NAND operation of an in-phase signal of the voltage conversion signal SAINMP and an inverted signal of the voltage conversion signal SAINME, conduction of the switch 29 is controlled, and depending on NAND operation of the in-phase signal of the voltage conversion signal SAINMP and the in-phase signal of the voltage conversion signal SAINME, conduction of the switch 31 is controlled, and depending on NAND operation of the inverted signal of the voltage conversion signal SAINMP and the inverted signal of the voltage conversion signal SAINME, conduction of the switch 33 is controlled.

Threshold voltage distribution of CAM monitor cells CAMMP and CAMME is shown in FIG. 12. Whether in program state or in erase state, the threshold voltage distribution has a peak inside of the threshold voltage distribution in normal memory cells. The bias voltage applied to the word lines when being read-out the data is set at intermediate voltage between threshold voltage distribution in program state and threshold voltage distribution in erase state, and the threshold voltage distribution of CAM monitor cells CAMMP and CAMME shows a distribution having a severest allowance for reading. The threshold voltage distribution of CAM cells has a threshold voltage distribution having a peak outside of the threshold voltage distribution of normal memory cells (FIG. 10), and therefore by judging the reading data when supply voltage VCC is applied to word lines of CAM monitor cells CAMMP and CAMME, the bias voltage to be applied to CAM cells can be estimated.

Prior to reading out data from CAM cells, supply voltage VCC is applied to word lines of CAM monitor cells CAMMP and CAMME, and data is read out into cascode circuits 35, 37. When data is read out normally by application of supply voltage VCC, in the CAM monitor cell CAMMP in program state, data current does not flow, and a signal of high logical voltage level is outputted from the cascode circuit 35. In the CAM monitor cell CAMME in erase state, data current flows, and a signal of low logical voltage level is outputted from the cascode circuit 37. In the CAM cells having threshold voltage distribution outside of threshold voltage distribution of CAM monitor cells CAMMP and CAMME, it is judged that data is read out normally by application of supply voltage VCC. The switch 29 is conducted by the bias changeover circuit 23, and supply voltage VCC is supplied to the CAM cells.

By application of supply voltage VCC, if data current does not flow in either one of CAM monitor cells CAMMP and CAMME, it is judged that the threshold voltage distribution of the CAM cell in erase state is at higher voltage side than the supply voltage VCC. From both of the cascode circuits 35, 37, signals of high logical voltage level are outputted. In the CAM cells, by application of supply voltage VCC, reading allowance for data in erase state is small, and risk of false reading is judged. The switch 31 is conducted by the bias changeover circuit 23, and a boosted voltage is applied to CAM cells from the boosting circuit 25.

By application of supply voltage VCC, if data current flows in both of CAM monitor cells CAMMP and CAMME, it is judged that the threshold voltage distribution of the CAM cell in program state is at lower voltage side than the supply voltage VCC. From both of the cascode circuits 35, 37, signals of low logical voltage level are outputted. In the CAM cells, by application of supply voltage VCC, reading allowance for data in program state is small, and risk of false reading is judged. The switch 33 is conducted by the bias changeover circuit 23, and a lowered voltage is applied to CAM cells from the step-down circuit 27.

Figure 13:
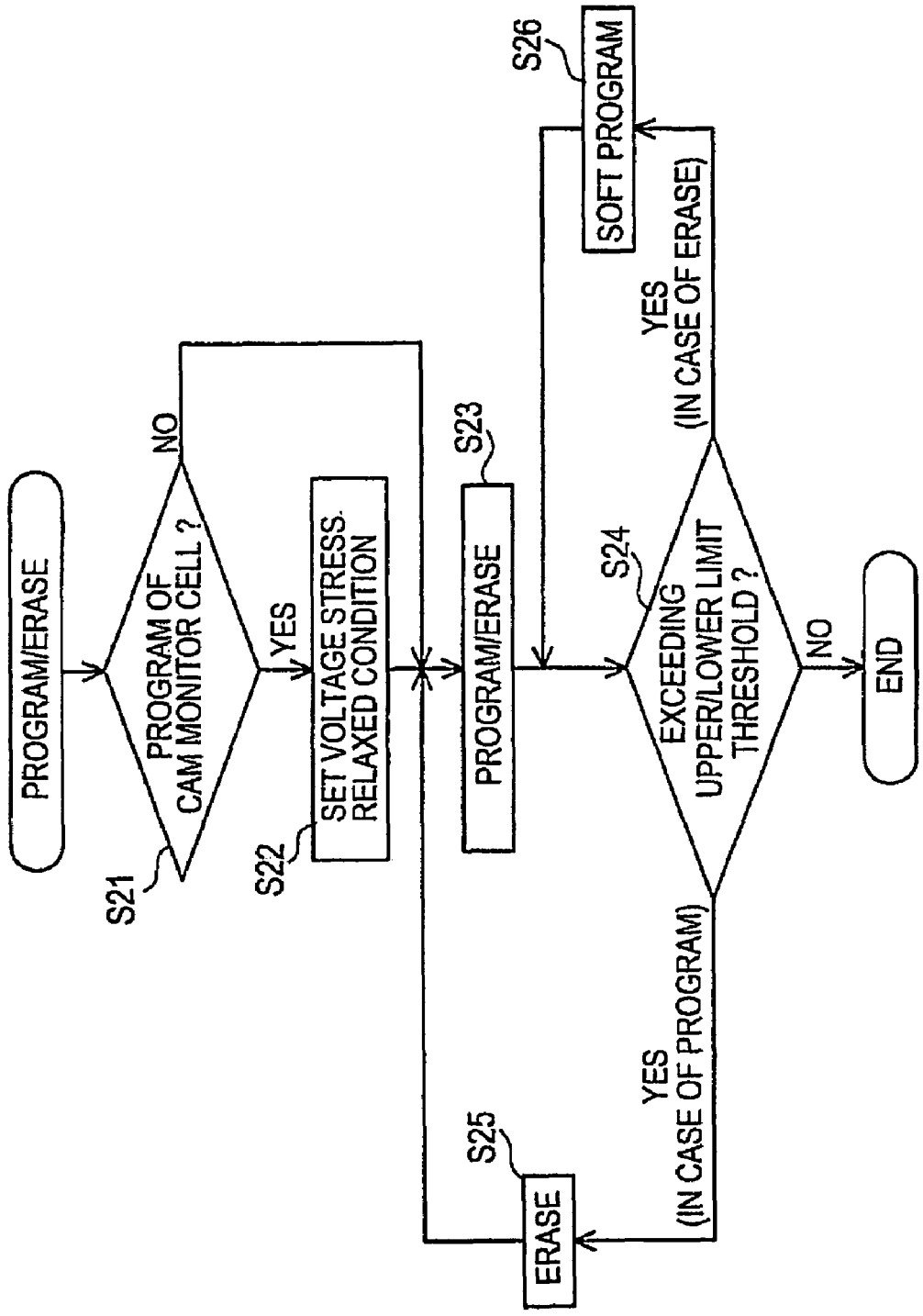
FIG. 13 is a flowchart of program or erase in CAM monitor cell.

FIG. 13 shows a program or erase flow of CAM monitor cells CAMMP and CAMME, in which when writing into the CAM monitor cell is judged (Yes at S21), voltage stress relaxed condition is set at stress application step in program (erase) action (S22). When the condition is set, program (erase) process is executed (S23). Since the voltage stress condition is relaxed, excessive stress is not applied, and the threshold voltage of the CAM monitor cell can be changed at small steps. As a result, the threshold voltage distribution of the CAM monitor cell is set at inside of threshold voltage distribution of normal memory cell as shown in FIG. 12.

Relaxation of voltage stress condition means shortening of step time width of voltage application and/or decreasing of increment of applied voltage between voltage application steps.

Further, process at steps S24 and S25 can be added. That is, in program process, as threshold voltage for verifying, an upper limit threshold voltage is defined in addition to a lower limit threshold voltage. When settling between these two threshold voltages, it is judged that the program is completed. When the threshold voltage of the CAM cell monitor of the program object becomes higher than the lower limit threshold, and the program process is terminated (S23), and further it is judged if exceeding the upper limit threshold voltage or not (S24). If exceeding (Yes at S24), erase process is executed (S25), and the operation returns to program process (S23). In erase process, as threshold voltage for verifying, a lower limit threshold voltage is defined in addition to the upper limit threshold voltage. When settling between these two threshold voltages, it is judged that the erase is completed. When the threshold voltage of the CAM cell monitor of the erase object becomes lower than the upper limit threshold, and the program process is terminated (S23), and further it is judged if exceeding the lower limit threshold voltage or not (S24). If lower than the lower limit threshold voltage (Yes at S24), soft program is executed (S26), and the operation returns to process S24.

As is clear from the explanation above, according to the foregoing embodiments, when constituting the CAM cell array for storing control information within the memory cell array, memory cells connected to the local bit line LBL0-0 are allocated as CAM cells, and a CAM cell array 1 is composed of sixteen CAM cells connected to the same bit line (first embodiment), of the memory cells connected to the word line WL0, sixteen adjacent memory cells connected to global bit lines GBL0 to GBL3 are allocated as CAM cells, and a CAM cell array 2 is composed (second embodiment), and of the memory cells connected to the word line WL0, sixteen memory cells connected to global bit lines GBL0 to GBL15 corresponding to the parallel data route of 16-bit width are allocated as CAM cells, and a CAM cell array 3 is composed (third embodiment).

In the sixteen CAM cells for constituting the CAM cell arrays 1 to 3 each, same bit data is stored, and control information of one bit is stored in CAM cell arrays 1 to 3. When the control information is read out from CAM cell arrays 1 to 3, same bit data is read out from all CAM cells in CAM cell arrays 1 to 3.

Since the data current being read out is reinforced by a predetermined number of times (16 times) of normal data reading, the current-voltage conversion can be executed at high speed in the cascode circuit.

When being read-out the control information, the driving capacity of reading route when being read-out is reinforced, and the reading time of control information is shortened when being read out at the time of turning on the power or initializing after resetting. It is hence possible to transfer to access action promptly.

Besides, since reinforcement of the driving capacity is assured by increase in the number of memory cells in which same bit data is stored and read out simultaneously, larger bias than that in normal access is not necessary in order to assure the driving capacity, and excess stress is not applied to memory cells and other devices. It is free from deterioration of reliability of device. Further, it is not necessary to add an exclusive bias generation circuit for outputting a different bias from that in the normal access action. Hence, the circuit configuration can be simplified.

For verifying program and/or erase of CAM cells, exclusive reference cells RCCP and RCCE are provided, and larger and/or smaller threshold voltage is provided as compared with reference cells RCP and RCE in program and/or erase of normal data, and therefore distribution of threshold voltage of CAM cells has a peak outside of distribution of threshold voltage of normal memory cells. When being read-out the control information in erase state, in addition to the fact that the number of cells is reinforced by a predetermined number of times (16 times), a large data current flows, and the signal can be converted to low logical level suddenly in the cascode circuit. When being read-out the control information in program state, if the number of cells is reinforced by a predetermined number of times (16 times), since the threshold voltage is larger than that of normal memory cells, leak current in bias application can be suppressed, and false detection in the cascode circuit can be prevented.

As voltage level of bias voltage applied to the CAM cell array, in principle, supply voltage VCC is used, and only when application of supply voltage VCC is not appropriate, it is designed to change over to boosted or lowered bias voltage, and therefore if the circuit operation is unstable when turning on the power or when initializing after resetting, control information can be read out immediately without waiting until the boosted or lowered voltage source is stabilized.

Having the same configuration as the CAM cell array, CAM monitor cells CAMMP and CAMME are provided for monitoring the program and erase state, and the threshold voltage distribution is a threshold voltage distribution having a peak inside of the threshold voltage distribution of normal memory cells, and therefore when being read-out the CAM monitor cells prior to reading out from the CAM cell array, reading is executed only in the condition of severe allowance for reading. Considering also that the CAM cell array has a threshold voltage distribution having a peak outside of threshold voltage distribution of normal memory cells, by judging the data being read out from the CAM monitor cells CAMP, CAMME for applying supply voltage VCC, the bias voltage to be applied to the CAM cells can be estimated.

The invention is not limited to the foregoing embodiments, but may be changed and modified in various forms without departing from the true spirit of the invention.

For example, combination of CAM cells for constituting the CAM cell array in the memory cell array is not limited to the examples in the first to third embodiment, but other combinations may be also applicable.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

Figure 16:
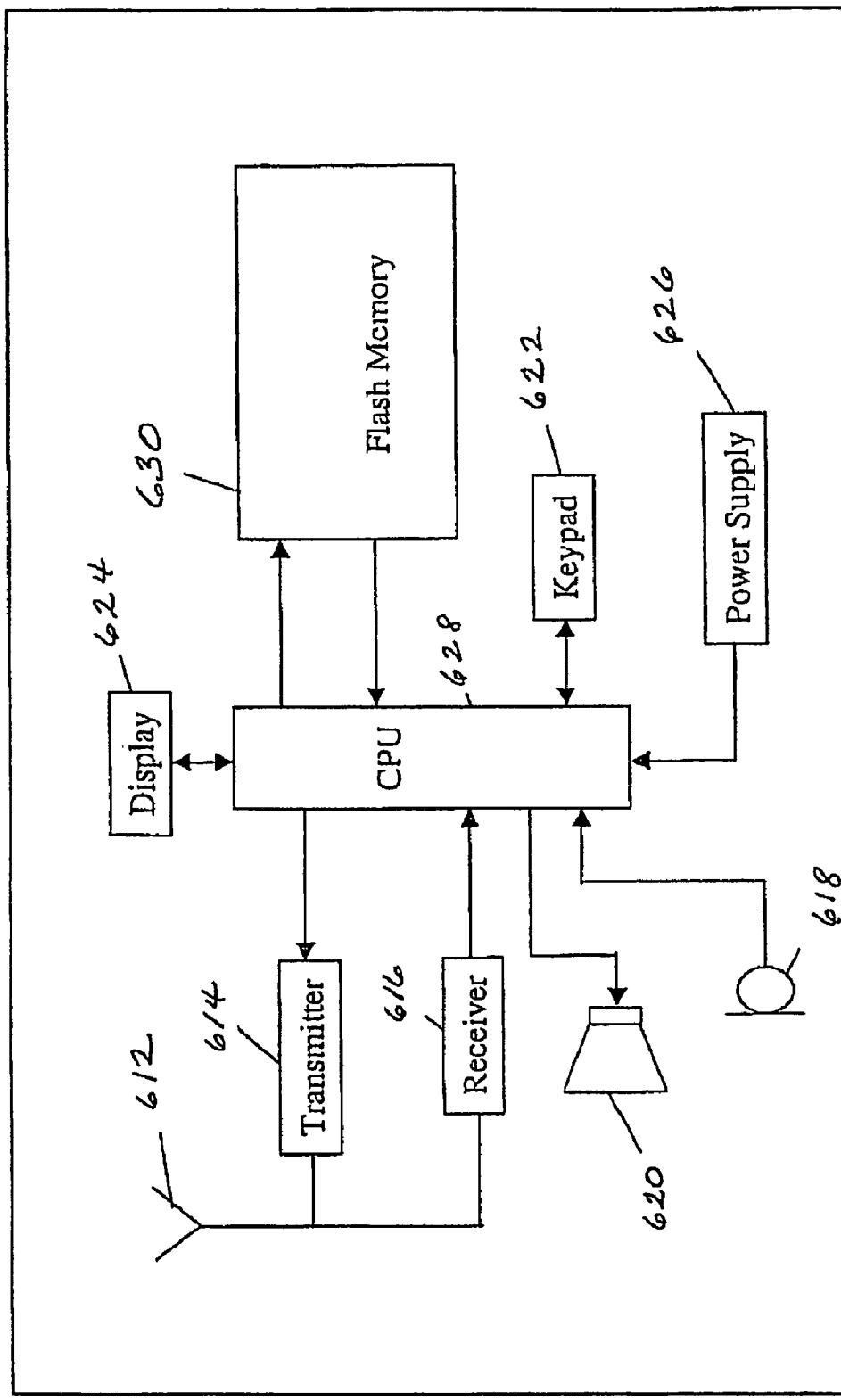
FIG. 16 shows a block diagram of a conventional portable telephone (a.k.a. cell phone, cellular phone, mobile phone, internet protocol phone, wireless phone, etc.), upon which embodiments can be implemented.

FIG. 16 shows a block diagram of a conventional portable telephone 610 (a.k.a. cell phone, cellular phone, mobile phone, internet protocol phone, wireless phone, etc.), upon which embodiments can be implemented. The cell phone 610 includes an antenna 612 coupled to a transmitter 614 a receiver 616, as well as, a microphone 618, speaker 620, keypad 622, and display 624. The cell phone 610 also includes a power supply 626 and a central processing unit (CPU) 628, which may be an embedded controller, conventional microprocessor, or the like. In addition, the cell phone 610 includes integrated, non-volatile memory 630.

In one embodiment, non-volatile memory 630 includes memory cell arrays allocated to normal-data storing regions and memory cell arrays allocated to control-information storing regions. In one embodiment, the control-information storing regions include memory cells that include a predetermined number of control-information storing memory cells per each bit of the control information. Moreover, identical bit data are stored in the predetermined number of control-information storing memory cells. Data-readout of the predetermined number of control-information storing memory cells is performed simultaneously.

Figure 14:
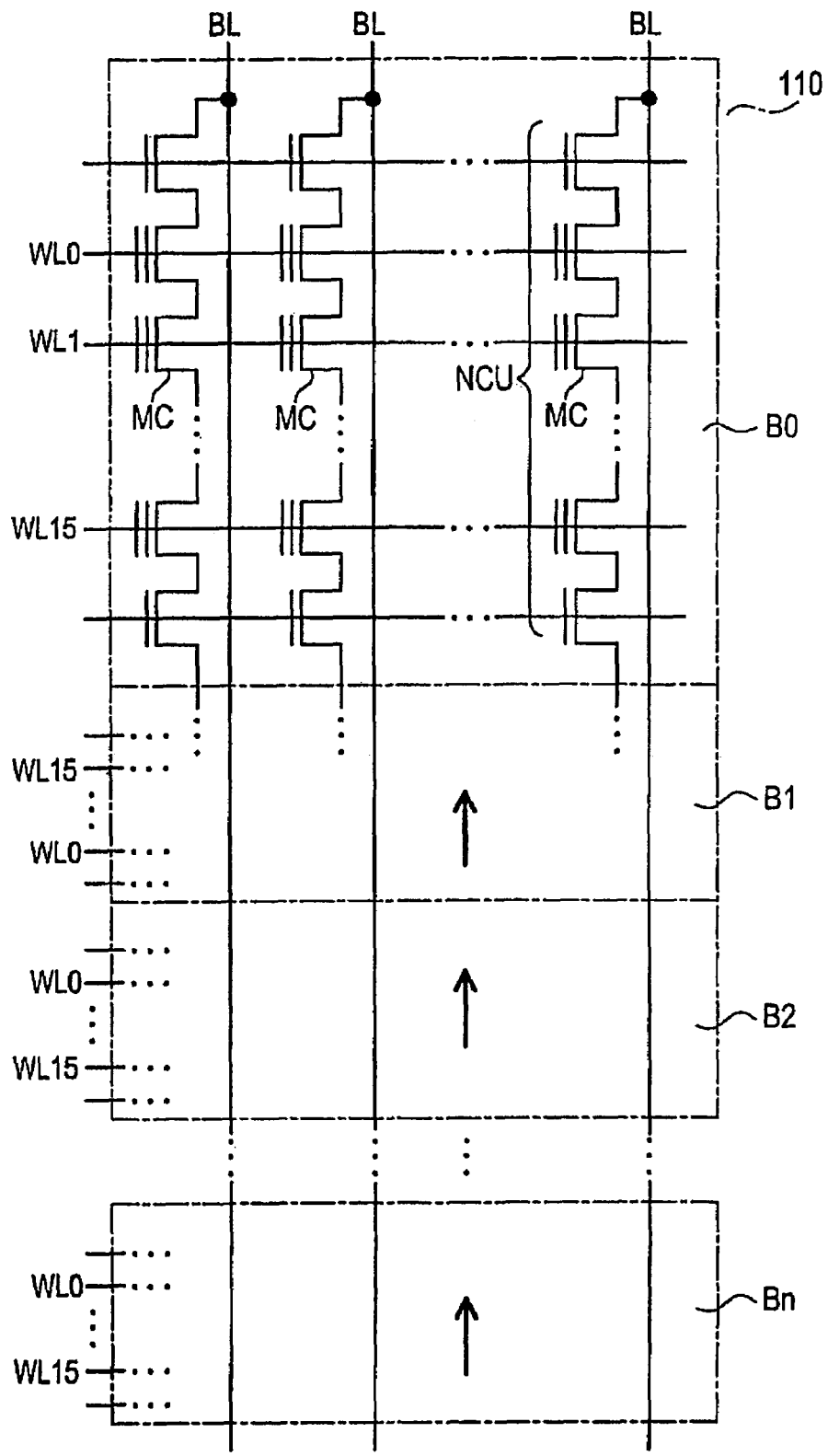
FIG. 14 is a diagram of memory cell in background art.
Figure 15:
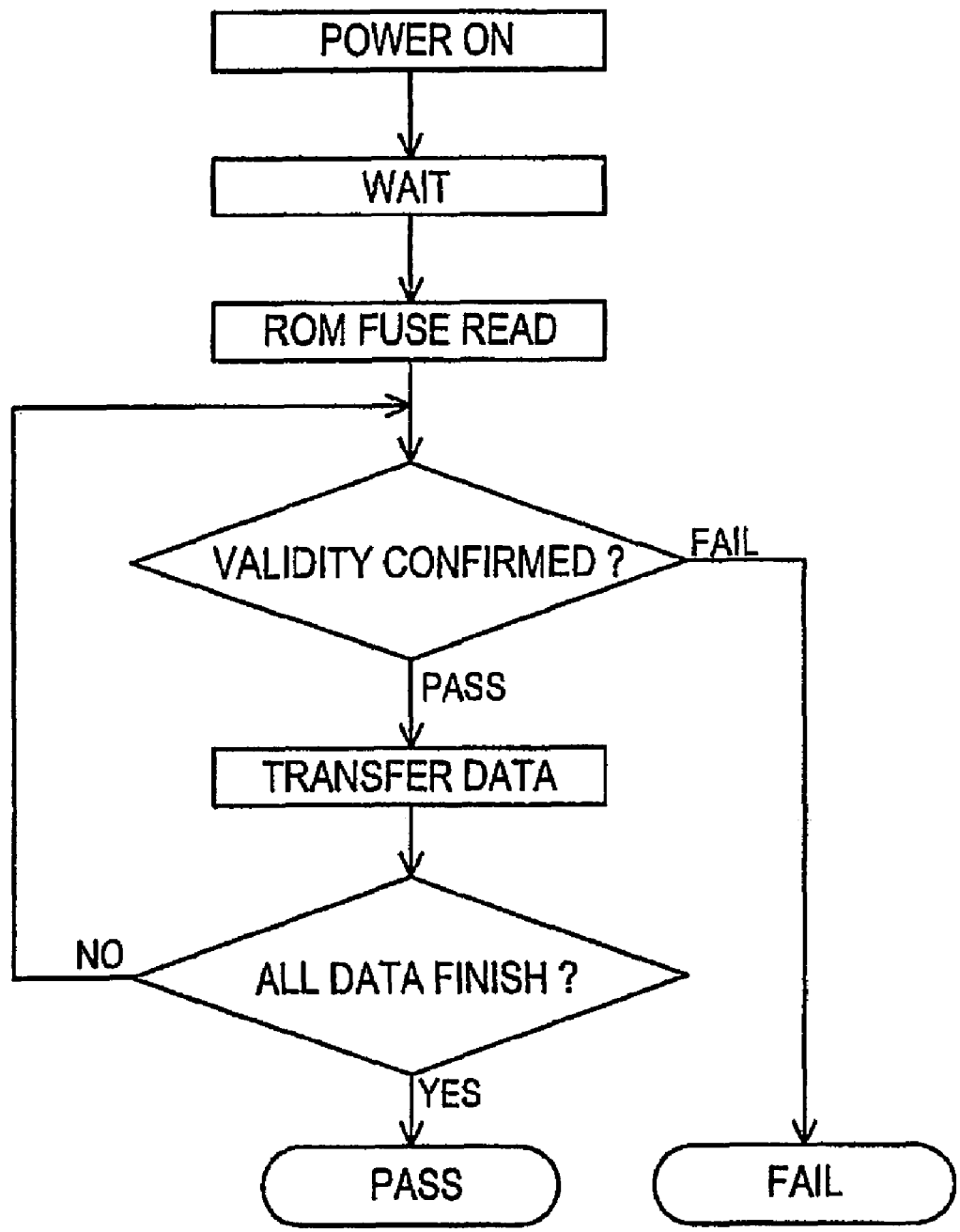
FIG. 15 is a flowchart of reading out control information when turning on the power source in background art.
Figure 17:
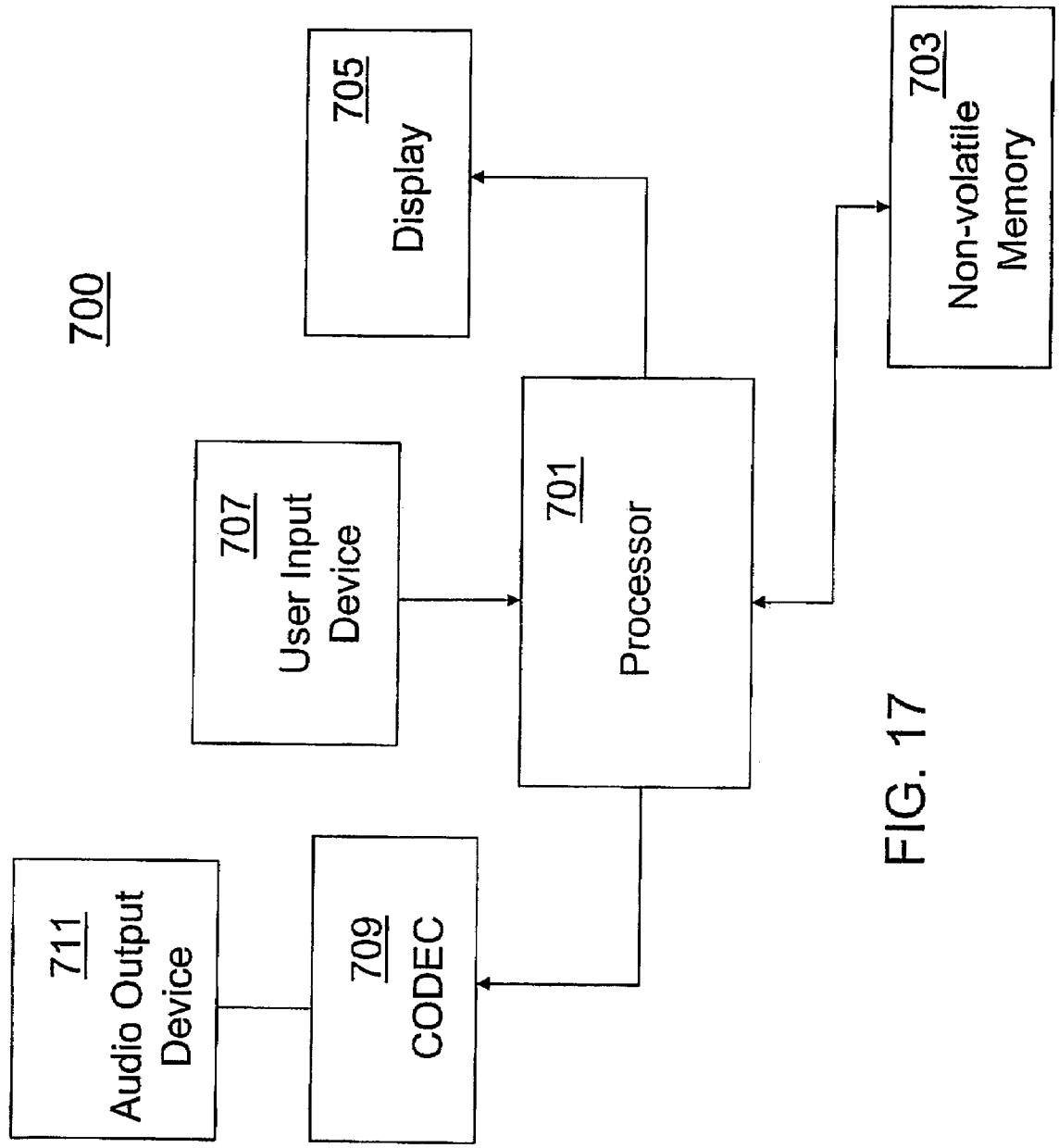
FIG. 17 shows a media player that uses a non-volatile memory device according to one embodiment of the present invention.

FIG. 17 shows a media player 700 that uses a non-volatile memory device according to one embodiment of the present invention. In the FIG. 14 embodiment, media player 700 includes processor 701, non-volatile memory 703, display 705, user input 707, codec 709 and audio output 711.

In operation, processor 701 executes playback of media files and controls the operation of media player 700. In one embodiment, user inputs made via user input 707 can be used to trigger file playback, file record, stop file playback, playback volume control, etc. Non-volatile memory 703 stores media files that may be stored for playback. In one embodiment, both audio and video files may be stored for playback.

CODEC 709 produces an analog output signal that is supplied to audio output 711. In one embodiment, the playback of audio files can be facilitated via audio output 711 which can include but is not limited to speakers and headphones. In one embodiment, the playback of video files can be facilitated by a display 705 screen.

In one embodiment, non-volatile memory 703 includes memory cell arrays allocated to normal-data storing regions and memory cell arrays allocated to control-information storing regions. In one embodiment, the control-information storing regions include memory cells that include a predetermined number of control-information storing memory cells per each bit of the control information. Moreover, identical bit data are stored in the predetermined number of control-information storing memory cells. Data-readout of the predetermined number of control-information storing memory cells is performed simultaneously.

Figure 18:
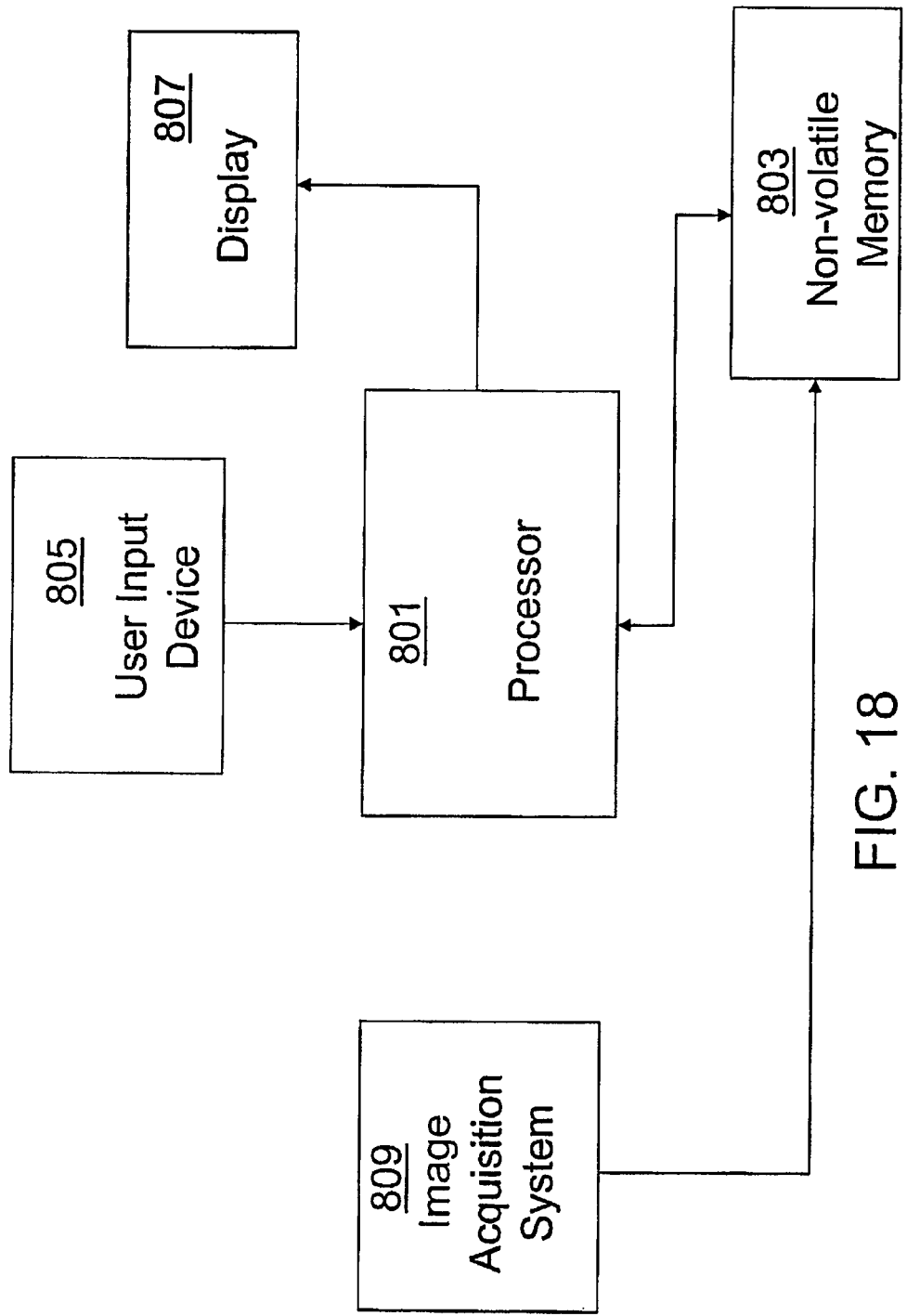
FIG. 18 shows a camera that uses a non-volatile memory device as is described in detail herein according to one embodiment of the present invention.

FIG. 18 shows a camera 800 that uses a non-volatile memory device as is described in detail herein according to one embodiment of the present invention. In the FIG. 18 embodiment, camera 800 includes processor 801, non-volatile memory 803, user input 805, display screen 807 and image acquisition system 809.

In operation, processor 801 controls the operation of camera 800 including the processing of image data acquired by image acquisition system 809. In one embodiment, user inputs made via user input 805 can be used to trigger image acquisition, storage, processing, display, etc. Non-volatile memory 803 stores image files that may be stored for uploading or, display purposes. In one embodiment, images may be presented on display screen 807.

In one embodiment, non-volatile memory 803 includes memory cell arrays allocated to normal-data storing regions and memory cell arrays allocated to control-information storing regions. In one embodiment, the control-information storing regions include memory cells that include a predetermined number of control-information storing memory cells per each bit of the control information. Moreover, identical bit data are stored in the predetermined number of control-information storing memory cells. Data-readout of the predetermined number of control-information storing memory cells is performed simultaneously.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 19:
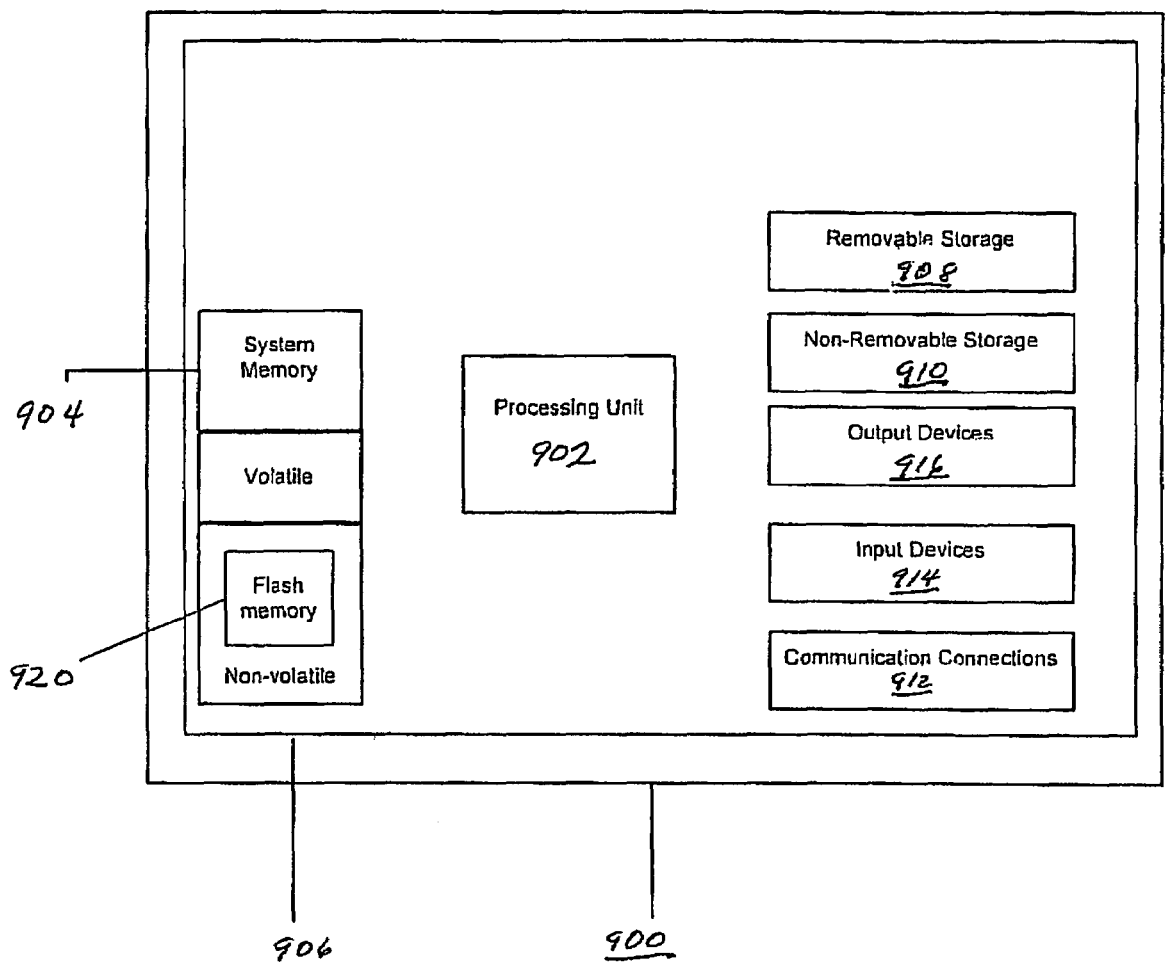
FIG. 19 illustrates a block diagram of a computing device 900, upon which embodiments of the present claimed subject matter can be implemented.

FIG. 19 illustrates a block diagram of a computing device 900, upon which embodiments of the present claimed subject matter can be implemented. Although computing device 900 is shown and described in FIG. 19 as having certain numbers and types of elements, the embodiments are not necessarily limited to the exemplary implementation. That is, computing device 900 can include elements other than those shown, and can include more than one of the elements that are shown. For example, computing device 900 can include a greater number of processing units than the one (processing unit 902) shown. Similarly, in another example, computing device 900 can include additional components not shown in FIG. 19.

Also, it is important to note that the computing device 900 can be a variety of things. For example, computing device 900 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 900 typically includes at least one processing unit 902 and memory 904. Depending on the exact configuration and type of computing device, memory 904 may be volatile (such as RAM), non-volatile (such as ROM, flash memory, etc.) or some combination of the two. This most basic configuration of computing device 900 is illustrated in FIG. 19 by line 906. Additionally, device 900 may also have additional features/functionality. For example, device 900 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 19 by removable storage 908 and non-removable storage 910. Computer storage media includes volatile and nonvolatile, removable and non-removable media implemented in any method or technology for storage of information such as computer readable instructions, data structures, program modules or other data. Memory 904, removable storage 908 and non-removable storage 610 are all examples of computer storage media.

Computer storage media includes, but is not limited to, RAM, ROM, EEPROM, flash memory 920 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 900. Any such computer storage media may be part of device 900. Further, in one embodiment, the flash memory 920 utilizes mirrorbit technology to allow storing of two physically distinct bits on opposite sides of a memory cell.

In the one embodiment, the aforementioned non-volatile memory can include a MOS transistor formed by adding impurities on a surface of a P-type substrate provided as a base. The P-type substrate includes a region of immediate-below-gate-layer on which the impurities are not added. The non-volatile memory can further include a first MOS device and a second MOS device, each of which has an N-type diffusion region on the surface of the P-type substrate which circumscribes the gate layer. In one embodiment, the first MOS device and the second MOS device constitute a first capacitive element by connecting a gate layer and an N-type diffusion layer of the first MOS device to an N-type diffusion layer and a gate layer of the second MOS device, respectively.

In one embodiment, the aforementioned non-volatile memory includes memory cell arrays allocated to normal-data storing regions and memory cell arrays allocated to control-information storing regions. In one embodiment, the control-information storing regions include memory cells that include a predetermined number of control-information storing memory cells per each bit of the control information. Moreover, identical bit data are stored in the predetermined number of control-information storing memory cells. Data-readout of the predetermined number of control-information storing memory cells is performed simultaneously.

Device 900 may also contain communications connection(s) 912 that allow the device to communicate with other devices. Communications connection(s) 912 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 900 may also have input device(s) 914 such as keyboard, mouse, pen, voice input device, game input device (e.g., a joy stick, a game control pad, and/or other types of game input device), touch input device, etc. Output device(s) 916 such as a display (e.g., a computer monitor and/or a projection system), speakers, printer, network peripherals, etc., may also be included. All these devices are well know in the art and need not be discussed at length here.

What is claimed is:

1. A non-volatile memory device comprising:
   memory cell arrays allocated to normal-data storing regions and comprising memory cells; and
   memory cell arrays allocated to control-information storing regions, wherein the control-information storing regions comprise memory cells including a predetermined number of control-information storing memory cells per each bit of the control information, and wherein identical bit data are stored in the predetermined number of control-information storing memory cells and wherein data-readout of the predetermined number of control-information storing memory cells is performed simultaneously.

2. The non-volatile memory device according to claim 1, wherein the predetermined number of control-information storing memory cells are connected to a common data-readout line.

3. The non-volatile memory device according to claim 1, wherein at least one pair of the predetermined number of control-information storing memory cells are connected to a common data-readout line, the common data-readout line being an exclusive line to which the at least one pair of the predetermined number of control-information storing memory cells are connected.

4. The non-volatile memory device according to claim 1, wherein the predetermined number of control-information storing memory cells are connected to a common bias line.

5. The non-volatile memory device according to claim 1, wherein at least one pair of the predetermined number of control-information storing memory cells are connected to a common bias line, the common bias line being an exclusive line to which the at least one pair of the predetermined number of control-information storing memory cells are connected.

6. The non-volatile memory device according to claim 1 further comprising an address decoder to which at least one address signal which identifies memory cells individually when accessing the normal data is inputted, the address decoder further having a control signal which masks the at least one address signal inputted thereto, the control signal dedicated to identify the predetermined number of control-information storing memory cells when accessing the control information.

7. The non-volatile memory device according to claim 1 further comprising:
   a first current-voltage converting section comprising a first resistance section having a first resistance level, the first resistance section converting data current read out from memory cells in the normal-data storing regions to a voltage value; and
   a second current-voltage converting section comprising a second resistance section having a second resistance level, the second resistance section converting data current read out from the predetermined number of control-information storing memory cells to a voltage value, wherein the second resistance level is lower than the first resistance level.

8. The non-volatile memory device according to claim 7 further comprising a first connection switching section which connects memory cells to the first current-voltage converting section when being read-out the data current from the memory cells, and which connects the predetermined number of control-information storing memory cells to the second current-voltage converting section when being read-out the data current from the predetermined number of control-information storing memory cells.

9. The non-volatile memory device according to claim 1 further comprising a current-voltage converting section comprising a resistance section, the resistance section converting data current read out from memory cells in the memory cell arrays to a voltage value,
   wherein the resistance section comprises a resistance switching section which switches a resistance value to a first resistance value when converting a data current from memory cells in the normal-data storing region, and which switches the resistance value to a second resistance value when converting data current from the predetermined number of control-information storing memory cells as a second resistance value, the second resistance value having a resistance level lower than a resistance level of the first resistance value.

10. The non-volatile memory device according to claim 1 further comprising:
    local readout lines connected to memory cells in the memory cell arrays;
    a global readout line connected to the local readout lines;
    a current-voltage converting section which converts data current read out from memory cells in the memory cell arrays to a voltage value; and
    a second connection switching section which connects the global readout line to the current-voltage converting section when being read-out the data current from the memory cells in the normal-data storing region, and which connects the local readout lines connected to the predetermined number of control-information storing memory cells to the current-voltage converting section when being read-out the data current from the predetermined number of control-information storing memory cells.

11. The non-volatile memory device according to claim 1 further comprising:
    a first control information reference cell which allows first threshold current to flow as a minimum threshold current for determining if a bit value stored is a first bit value when verifying a data-write state of the predetermined number of control-information storing memory cells; and
    a second control information reference cell which allows second threshold current to flow as a maximum threshold current for determining if a bit value stored is a second bit value when verifying the data-write state of the predetermined number of control-information storing memory cells,
    wherein the first threshold current has a current value higher than the minimum threshold current when determining that the first bit value is written in memory cells in the normal-data storing regions, and the second threshold current has a current value lower than the maximum threshold current when determining that the second bit value is written in the memory cells.

12. The non-volatile memory device according to claim 1 further comprising:
    a bias line which applies bias voltage when being read-out the data from the predetermined number of control-information storing memory cells; and
    a bias setting section coupled to the bias line which controls a voltage value of the bias voltage.

13. The non-volatile memory device according to claim 12, wherein the bias setting section varies the voltage value of the bias voltage among at least one voltage of an external voltage supplied from an external source, a lowered voltage corresponding to the external voltage having a voltage level which is lowered, and a boosted voltage corresponding to the external voltage having a voltage level which is boosted.

14. The non-volatile memory device according to claim 13, wherein the bias setting section has:
    a voltage-level converting section which converts the voltage level of the external voltage; and
    a bias switching section which switches between an output voltage of the voltage-level converting section and the external voltage.

15. The non-volatile memory device according to claim 12 further comprising:
    first monitor cells which have a first threshold voltage with a first voltage level;
    second monitor cells which have a second threshold voltage with a second voltage level, the second voltage level being deeper than the first voltage level; and
    a voltage judging section which judges appropriability of the bias voltage in response to current read out from the first monitor cells and the second monitor cells depending upon an application of the bias voltage,
    wherein a voltage value of the bias voltage is controlled in response to a judgment result of the voltage judging section prior to data read out from the predetermined number of control-information storing memory cells.

16. The non-volatile memory device according to claim 15, wherein the first monitor cells and the second monitor cells each have as many memory cells as the predetermined number of control-information storing memory cells, and they have a connection structure identical to the predetermined number of control-information storing memory cells.

17. The non-volatile memory device according to claim 15, wherein the first monitor cells comprises a number of memory cells smaller than the number of memory cells comprising the predetermined number of control-information storing memory cells.

18. The non-volatile memory device according to claim 15, wherein the second monitor cells comprises a number of memory cells larger than the number of memory cells comprising the predetermined number of control-information storing memory cells.

19. The non-volatile memory device according to claim 15, wherein memory cells in the normal-data storing region has a first state that a first bit value is stored therein in response to a distribution of a third threshold voltage including the first threshold voltage and a second state that a second bit value is stored therein in response to a distribution of a fourth threshold voltage including the second threshold voltage, wherein the first threshold voltage has a minimum value within the distribution of the third threshold voltage, and wherein the second threshold voltage has a maximum value within the distribution of the fourth threshold voltage.

20. A control method in a non-volatile semiconductor device comprising memory cells allocated for storing normal data and memory cells allocated for storing control information, the control method comprising the steps of:

allocating a predetermined number of memory cells for each bit of the control information;

storing identical-bit data in the predetermined number of memory cells; and simultaneously reading out the identical-bit data stored in the predetermined number of memory cells.

21. The control method of a non-volatile semiconductor device according to claim 20, wherein the step of storing identical-bit data comprises the step of overwriting data of each of the predetermined number of memory cells in order with a same procedure to overwrite the normal data.

22. The control method of a non-volatile semiconductor device according to claim 20, wherein the step of storing identical-bit data comprises the step of simultaneously overwriting data of each of the predetermined number of memory cells in the same manner as the step of simultaneously reading out the identical-bit data.

23. The control method of a non-volatile semiconductor device according to claim 20 further comprising the steps of:

initializing an output voltage value of a bi-level voltage signal of the control information prior to the step of simultaneously reading out the identical-bit data; and converting a data current of the bi-level voltage signal by, after the step of initializing an output voltage, allowing the data current to be read out during the step of simultaneously reading out the identical-bit data to flow.

24. The control method of a non-volatile semiconductor device according to claim 20 further comprising the steps of:

setting a minimum threshold current to determine whether a bit value stored is a first bit value to be larger one than a minimum threshold current for determining whether memory cells store the normal data when control information is written in a memory cell; and setting a maximum threshold current to determine whether a bit value stored is a second bit value to be smaller one than a maximum threshold current for determining whether memory cells store the normal data when control information is written in a memory cell.

25. The control method of a non-volatile semiconductor device according to claim 20 further comprising the steps of:

reading out data from monitor cells which have characteristics similar to the memory cells allocated for storing the control information prior to reading out data from the memory cells allocated for storing the control information;

determining a bias voltage to be applied to the memory cells in response to the step of reading out data from the monitor cells; and switching the bias voltage in response to the step of determining the bias voltage.

26. A computing device comprising:

a processor;

an input component;

an output component;

a memory comprising:

a volatile memory; and a non-volatile memory comprising:

memory cell arrays allocated to normal-data storing regions and comprising memory cells; and memory cell arrays allocated to control-information storing regions, wherein the control-information storing regions comprise memory cells including a predetermined number of control-information storing memory cells per each bit of the control information, and wherein identical bit data are stored in the predetermined number of control-information storing memory cells and wherein data-readout of the predetermined number of control-information storing memory cells is performed simultaneously.

27. A wireless communications device, said wireless communications device comprising:

a non-volatile memory comprising:

memory cell arrays allocated to normal-data storing regions and comprising memory cells; and memory cell arrays allocated to control-information storing regions, wherein the control-information storing regions comprise memory cells including a predetermined number of control-information storing memory cells per each bit of the control information, and wherein identical bit data are stored in the predetermined number of control-information storing memory cells and wherein data-readout of the predetermined number of control-information storing memory cells is performed simultaneously, a processor;

a communications component;

a transmitter;

a receiver; and an antenna connected to the transmitter circuit and the receiver circuit.

28. A media content player comprising:

a non-volatile memory that stores one or more media content items, said non-volatile memory comprising:

memory cell arrays allocated to normal-data storing regions and comprising memory cells; and memory cell arrays allocated to control-information storing regions, wherein the control-information storing regions comprise memory cells including a predetermined number of control-information storing memory cells per each bit of the control information, and wherein identical bit data are stored in the predetermined number of control-information storing memory cells and wherein data-readout of the predetermined number of control-information storing memory cells is performed simultaneously, a user input that enables the selection of on or more of said media item;

a processor coupled to said user input and said storage component that causes the playback of a selected media item, and one or more playback devices for conveying the playback of said media item.

29. An image acquisition system, comprising:

an image acquisition component for acquiring image data;

a storage component for storing image data, said storage component comprising non-volatile memory comprising:

memory cell arrays allocated to normal-data storing regions and comprising memory cells; and memory cell arrays allocated to control-information storing regions, wherein the control-information storing regions comprise memory cells including a predetermined number of control-information storing memory cells per each bit of the control information, and wherein identical bit data are stored in the predetermined number of control-information storing memory cells and wherein data-readout of the predetermined number of control-information storing memory cells is performed simultaneously, and a display unit for displaying said image data stored in said storage component.

* * * * *